US008344142B2

(12) United States Patent
Marder et al.

(10) Patent No.: US 8,344,142 B2
(45) Date of Patent: Jan. 1, 2013

(54) PERYLENE CHARGE-TRANSPORT MATERIALS, METHODS OF FABRICATION THEREOF, AND METHODS OF USE THEREOF

(75) Inventors: Seth Marder, Atlanta, GA (US); Zesheng An, Santa Barbara, CA (US); Steve Barlow, Atlanta, GA (US); Bernard Kippelen, Decatur, GA (US)

(73) Assignee: Georgia Tech Research Corporation, Atlanta, GA (US)

( * ) Notice: Subject to any disclaimer, the term of this patent is extended or adjusted under 35 U.S.C. 154(b) by 1176 days.

(21) Appl. No.: 11/629,273

(22) PCT Filed: Jun. 14, 2005

(86) PCT No.: PCT/US2005/020815
§ 371 (c)(1),
(2), (4) Date: Mar. 20, 2008

(87) PCT Pub. No.: WO2005/124453
PCT Pub. Date: Dec. 29, 2005

(65) Prior Publication Data
US 2008/0223444 A1    Sep. 18, 2008

Related U.S. Application Data

(60) Provisional application No. 60/579,316, filed on Jun. 14, 2004.

(51) Int. Cl.
*C07D 471/02* (2006.01)
(52) U.S. Cl. .......... 546/37; 136/263; 526/204; 526/259; 252/301.16; 428/704
(58) Field of Classification Search .................. 136/263; 546/37; 526/259, 204; 428/704; 252/301.16
See application file for complete search history.

(56) References Cited

U.S. PATENT DOCUMENTS

| | | | |
|---|---|---|---|
| 4,714,666 A | 12/1987 | Wiedemann et al. | 430/59 |
| 5,164,276 A | 11/1992 | Robinson et al. | 430/59 |
| 5,288,584 A | 2/1994 | Yu et al. | 430/128 |
| 5,330,865 A | 7/1994 | Leus et al. | 430/59 |
| 5,521,047 A | 5/1996 | Yuh et al. | 430/134 |
| 5,645,965 A | 7/1997 | Duff et al. | 430/59 |
| 5,891,594 A | 4/1999 | Yuh et al. | 430/71 |
| 5,952,140 A | 9/1999 | Visser et al. | 430/59 |
| 6,060,601 A * | 5/2000 | Langhals et al. | 546/37 |
| 6,162,251 A | 12/2000 | Kredovski | 623/8 |
| 6,165,661 A | 12/2000 | Hsiao et al. | 430/59 |
| 6,180,309 B1 | 1/2001 | Maty et al. | 430/130 |
| 6,184,378 B1 * | 2/2001 | Bohm et al. | 546/37 |
| 6,294,300 B1 | 9/2001 | Carmichael et al. | 430/58.8 |
| 6,300,027 B1 | 10/2001 | Chambers et al. | 430/58.2 |
| 6,916,928 B2 * | 7/2005 | Becker et al. | 546/37 |
| 2005/0287454 A1 | 12/2005 | Belknap et al. | |
| 2006/0008717 A1 | 1/2006 | Uematsu et al. | |
| 2006/0177748 A1 | 8/2006 | Wu et al. | |
| 2006/0275682 A1 | 12/2006 | Tong et al. | |
| 2007/0023747 A1 | 2/2007 | Loutfy et al. | |
| 2008/0008949 A1 | 1/2008 | Wu et al. | |

OTHER PUBLICATIONS

USPTO Search Report, Jun. 2011.*
International Search Report for PCT/US05/20815.

* cited by examiner

*Primary Examiner* — Gregory Listvoyb
(74) *Attorney, Agent, or Firm* — Thomas Horstemeyer, LLP

(57) ABSTRACT

Briefly described, embodiments of this disclosure include perylenetetracarboxylic diimide charge-transport materials, methods of forming perylenetetracarboxylic diimide charge-transport materials, and methods of using the perylenetetracarboxylic diimide charge-transport materials.

3 Claims, 9 Drawing Sheets

PERYLENE CHARGE-TRANSPORT MATERIALS, METHODS OF FABRICATION THEREOF, AND METHODS OF USE THEREOF

CROSS-REFERENCE TO RELATED APPLICATION

This application claims priority to U.S. provisional patent application entitled "PEREYLENE CONTAINING MATERIALS FOR USE IN ORGANIC ELECTRONIC AND OPTOELECTRONICS" filed on Jun. 14, 2004 and accorded Ser. No. 60/579,316, which is entirely incorporated herein by reference.

STATEMENT REGARDING FEDERALLY SPONSORED RESEARCH OR DEVELOPMENT

The U.S. government may have a paid-up license in embodiments of this disclosure and the right in limited circumstances to require the patent owner to license others on reasonable terms as provided for by the terms of grants awarded by the Office of Naval Research (grant # N00014-04-1-0120) and the National Science Foundation (grant # DMR 0120967 and grant # ECS-0309131) of the U.S. Government.

BACKGROUND

Charge-transport molecular and polymeric materials are semiconducting materials in which charges can migrate under the influence of an electric field. These charges may be present due to doping with oxidizing or reducing agents, so that some fraction of the transport molecules or polymer repeat units is present as radical cations or anions. More usually, charges are introduced by injection from another material under the influence of an electric field. Charge-transport materials may be classified into hole- and electron-transport materials. In a hole-transport material, electrons are removed, either by doping or injection, from a filled manifold of orbitals to give positively charged molecules or polymer repeat units. Transport takes place by electron-transfer between a molecule or polymer repeat unit and the corresponding radical cation; this can be regarded as movement of a positive charge (hole) in the opposite direction to this electronic motion. In an electron-transport material, extra electrons are added, either by doping or injection; here the transport process includes electron-transfer from the radical anion of a molecule or polymer repeat unit to the corresponding neutral species. In addition, some material—ambi-polar materials—may transport both holes and electrons.

SUMMARY

Briefly described, embodiments of this disclosure include perylenetetracarboxylic diimide charge-transport materials; polymers, co-polymers, and homopolymers, including perylenetetracarboxylic diimide charge-transport materials; polymer layers including perylenetetracarboxylic diimide charge-transport materials; mixtures including perylenetetracarboxylic diimide charge-transport monomers; and devices including perylenetetracarboxylic diimide charge-transport materials.

One exemplary perylenetetracarboxylic diimide charge-transport material, among others, is a perylenetetracarboxylic diimide charge-transport material monomer having a structure of Formula I:

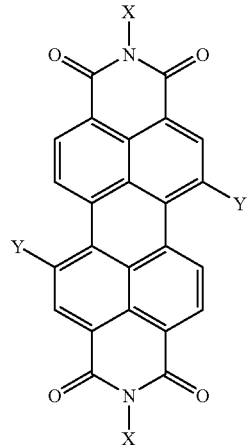

Formula I where Y in each instance can be independently selected from the following: H, CN, acceptors, donors, and a polymerizable group; and where X in each instance can be independently selected from the following: a polymerizable group; 3,4,5-trialkoxyphenyl; 3,4,5-trialkylphenyl; 3,4,5-tri-perfluorinated-alkylphenyl; 3,4,5-tri-perfluorinated-alkoxyphenyl; 3,4,5-tri-oligomeric-ether-substituted phenyl; 3,4,5-trialkoxybenzyl; 3,4,5-trialkylbenzyl; 3,4,5-tri-perfluorinated-alkyl benzyl; 3,4,5-tri-perfluorinated-alkoxy benzyl; 3,4,5-tri-oligomeric-ether-substituted benzyl; 3,4-dialkoxyphenyl, 3,4-dialkylphenyl; 3,4-di-perfluorinated-alkylphenyl; 3,4-di-perfluorinated-alkoxyphenyl; 3,4-di-oligomeric-ether-substituted phenyl; 3,4-dialkoxybenzyl; 3,4-dialkylbenzyl; 3,4-di-perfluorinated-alkylbenzyl; 3,4-di-perfluorinated-alkoxybenzyl; 3,4-di-oligomeric-ether-substituted benzyl; 3,5-dialkoxyphenyl; 3,5-dialkylphenyl; 3,5-di-perfluorinated-alkyl phenyl; 3,5-di-perfluorinated-alkoxy phenyl; 3,5-di-oligomeric-ether-substituted phenyl; 3,5-dialkoxybenzyl; 3,5-dialkylbenzyl; 3,5-di-perfluorinated-alkyl benzyl; 3,5-di-oligomeric-ether-substituted benzyl; or the following units:

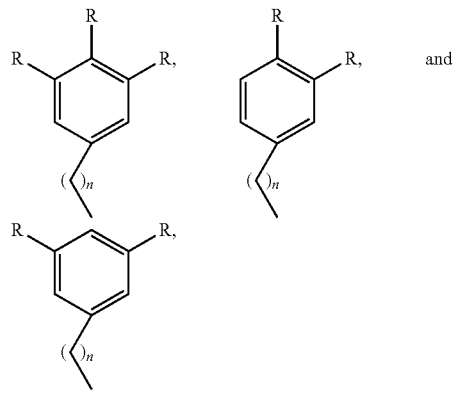

where R in each instance can be independently selected from the following: a polymerizable group, an alkyl, an alkoxy, a perfluorinated alkyl, a perfluorinated alkoxy, an oligomeric-ether, wherein R may denote units that can form dendrimers, and wherein the subscript n is a number from 0 to 20.

Another exemplary charge-transport material, among others, includes a perylenetetracarboxylic diimide charge-transport material monomer having a structure of Formula I shown above: where Y in each instance can be independently selected from the following: H, CN, acceptors, donors, a polymerizable group; and X in each instance can be independently selected from the following: a polymerizable group; hydrogen; halogens; $C_1$-$C_{18}$-alkyl; aryloxy; arylthio; heteroaryloxy; and heteroarylthio, and wherein each can be independently substituted by the following: $C_1$-$C_{10}$-alkyl, $C_1$-$C_6$-alkoxy, cyano, and carboxyl.

An exemplary charge-transport material, among others, includes a perylenetetracarboxylic diimide charge-transport material monomer having a structure of Formula I shown above: where Y in each instance can be independently selected from the following: H, CN, acceptors, donors, a polymerizable group; and where X in each instance can be independently selected from the following: a polymerizable group; methyl, ethyl, propyl, isopropyl, butyl, isobutyl, sec-butyl, tert-butyl, pentyl, isopentyl, neopentyl, tert-pentyl, hexyl, 2-methylpentyl, heptyl, 1-ethylpentyl, octyl, 2-ethylhexyl, isooctyl, nonyl, isononyl, decyl, isodecyl, undecyl, dodecyl, tridecyl, isotridecyl, tetradecyl, pentadecyl, hexadecyl, heptadecyl, octadecyl, nonadecyl and eicosyl; 2-methoxyethyl, 2-ethoxyethyl, 2-propoxyethyl, 2-isopropoxyethyl, 2-butoxyethyl, 2-methoxypropyl, 3-methoxypropyl, 2-ethoxypropyl, 3-ethoxypropyl, 2-propoxypropyl, 3-propoxypropyl, 2-butoxypropyl, 3-butoxypropyl, 2-methoxybutyl, 4-methoxybutyl, 2-ethoxybutyl, 4-ethoxybutyl, 2-propoxybutyl, 4-propoxybutyl, 3,6-dioxaheptyl, 3,6-dioxaoctyl, 4,8-dioxanonyl, 3,7-dioxaoctyl, 3,7-dioxanonyl, 4,7-dioxaoctyl, 4,7-dioxanonyl, 2- and 4-butoxybutyl, 4,8-dioxadecyl, 3,6,9-trioxadecyl, 3,6,9-trioxaundecyl, 3,6,9-trioxadodecyl, 3,6,9,12-tetraoxamidecyl and 3,6,9,12-tetraoxatetradecyl; 2-methylthioethyl, 2-ethylthioethyl, 2-propylthioethyl, 2-isopropylthioethyl, 2-butylthioethyl, 2-methylthiopropyl, 3-methylthiopropyl, 2-ethylthiopropyl, 3-ethylthiopropyl, 2-propylthiopropyl, 3-propylthiopropyl, 2-butylthiopropyl, 3-butylthiopropyl, 2-methylthiobutyl, 4-methylthiobutyl, 2-butylthiopropyl, 4-ethylthiobutyl, 2-propylthiobutyl, 4-propylthiobutyl, 3,6-dithiaheptyl, 3,6-dithiaoctyl, 4,8-dithianonyl, 3,7-dithiaoctyl, 3,7-dithianonyl, 4,7-dithiaoctyl, 4,7-dithianonyl, 2-butylthiobutyl, 4-butylthiobutyl, 4,8-dithiadecyl, 3,6,9-trithiadecyl, 3,6,9-trithiaundecyl, 3,6,9-trithiadodecyl, 3,6,9,12-tetrathiamidecyl, 3,6,9,12-tetrathiatetradecyl; 2-monomethylaminoethyl, 2-monoethylaminoethyl, 2-dimethylaminoethyl, 2-dimethylaminopropyl, 3-dimethylaminopropyl, 3-monoisopropylaminopropyl, 2-monopropylaminobutyl, 4-monopropylaminobutyl, 2-dimethylaminobutyl, 4-dimethylaminobutyl, 6-methyl-3,6-diazaheptyl, 3,6-dimethyl-3,6-diazaheptyl, 3,6-diazaoctyl, 3,6-dimethyl-3,6-diazaoctyl, 9-methyl-3,6,9-triazadecyl, 3,6,9-trimethyl-3,6,9-triazadecyl, 3,6,9-triazaundecyl, 3,6,9-trimethyl-3,6,9-triazaundecyl, 12-methyl-3,6,9,12-tetraazamidecyl and 3,6,9,12-tetramethyl-3,6,9,12-tetraazamidecyl; propan-2-on-1-yl, butan-3-on-1-yl, butan-3-on-2-yl and 2-ethylpentan-3-on-1-yl; 2-methylsulfonylethyl, 2-ethylsulfonylethyl, 2-propylsulfonylethyl, 2-isopropylsulfonylethyl, 2-butylsulfonylethyl, 2-methylsulfonylpropyl, 3-methylsulfonylpropyl, 2-ethylsulfonylpropyl, 3-ethylsulfonylpropyl, 2-propylsulfonylpropyl, 3-propylsulfonylpropyl, 2-butylsulfonylpropyl, 3-butylsulfonylpropyl, 2-methylsulfonylbutyl, 4-methylsulfonylbutyl, 2-ethylsulfonylbutyl, 4-ethylsulfonylbutyl, 2-propylsulfonylbutyl, 4-propylsulfonylbutyl, and 4-butylsulfonylbutyl; carboxymethyl, 2-carboxyethyl, 3-carboxypropyl, 4-carboxybutyl, 5-carboxypentyl, 6-carboxyhexyl, 8-carboxyoctyl, 10-carboxydecyl, 12-carboxydodecyl and 14-carboxytetradecyl; sulfomethyl, 2-sulfoethyl, 3-sulfopropyl, 4-sulfobutyl, 5-sulfopentyl, 6-sulfohexyl, 8-sulfooctyl, 10-sulfodecyl, 12-sulfododecyl and 14-sulfotetradecyl; 2-hydroxyethyl, 2-hydroxypropyl, 1-hydroxyprop-2-yl, 2-hydroxybutyl, 4-hydroxybutyl, 1-hydroxybut-2-yl and 8-hydroxy-4-oxaoctyl, 2-cyanoethyl, 3-cyanopropyl, 2-methyl-3-ethyl-3-cyanopropyl, 7-cyano-7-ethylheptyl and 4-methyl-7-methyl-7-cyanoheptyl; methoxy, ethoxy, propoxy, isopropoxy, butoxy, isobutoxy, sec-butoxy, tert-butoxy, pentoxy, isopentoxy, neopentoxy, tert-pentoxy and hexoxy; carbamoyl, methylaminocarbonyl, ethylaminocarbonyl, propylaminocarbonyl, butylaminocarbonyl, pentylaminocarbonyl, hexylaminocarbonyl, heptylaminocarbonyl, octylaminocarbonyl, nonylaminocarbonyl, decylaminocarbonyl and phenylaminocarbonyl; formylamino, acetylamino, propionylamino and benzoylamino; chlorine, bromine and iodine; phenylazo, 2-naphthylazo, 2-pyridylazo and 2-pyrimidylazo; cyclopentyl, cyclohexyl, cycloheptyl, cyclooctyl, 2-dioxanyl, 4-morpholinyl, 2-tetrahydrofuryl, 3-tetrahydrofuryl, 1-pyrrolidinyl, 2-pyrrolidinyl, 3-pyrrolidinyl and 1-piperidyl, 2-piperidyl, 3-piperidyl, and 4-piperidyl; phenyl, 2-naphthyl, 2-pyrryl, and 3-pyrryl, 2-pyridyl, 3-pyridyl, 4-pyridyl, 2-pyrimidyl, 4-pyrimidyl, 5-pyrimidyl, 3-pyrazolyl, 4-pyrazolyl, 5-pyrazolyl, 2-imidazolyl, 4-imidazolyl, 5-imidazolyl, 2-thiazolyl, 4-thiazolyl, 5-thiazolyl, 3-(1,2,4-triazyl), 2-(1,3,5-triazyl), 6-quinaldyl, 3-quinolinyl, 5-quinolinyl, 6-quinolinyl, 8-quinolinyl, 2-benzoxazolyl, 2-benzothiazolyl, 5-benzothiadiazolyl, 2-benzimidazolyl, 5-benzimidazolyl, and 1-isoquinolyl, and 5-isoquinolyl; 2-methylphenyl, 3-methylphenyl, 4-methylphenyl, 2,4-dimethylphenyl, 3,5-dimethylphenyl, 2,6-dimethylphenyl, 2,4,6-trimethylphenyl, 2-ethylphenyl, 3-ethylphenyl, 4-ethylphenyl, 2,4-diethylphenyl, 3,5-diethylphenyl, 2,6-diethylphenyl, 2,4,6-triethylphenyl, 2-propylphenyl, 3-propylphenyl, 4-propylphenyl, 2,4-, 3,5- and 2,6-dipropylphenyl, 2,4,6-tripropylphenyl, 2-isopropylphenyl, 3-isopropylphenyl, 4-isopropylphenyl, 2,4-diisopropylphenyl, 3,5-diisopropylphenyl, 2,6-diisopropylphenyl, 2,4,6-triisopropylphenyl, 2-butylphenyl, 3-butylphenyl, 4-butylphenyl, 2,4-dibutylphenyl, 3,5-dibutylphenyl, 2,6-dibutylphenyl, 2,4,6-tributylphenyl, 2-isobutylphenyl, 3-isobutylphenyl, 4-isobutylphenyl, 2,4-diisobutylphenyl, 3,5-diisobutylphenyl, 2,6-diisobutylphenyl, 2,4,6-triisobutylphenyl, 2-butylphenyl, 3-butylphenyl, 4-sec-butylphenyl, 2,4-, 3,5- and 2,6-di-sec-butylphenyl and 2,4,6-tri-sec-butylphenyl; 2-methoxyphenyl, 3-methoxyphenyl, 4-methoxyphenyl, 2,4-dimethoxyphenyl, 3,5-dimethoxyphenyl, 2,6-dimethoxyphenyl, 2,4,6-trimethoxyphenyl, 2-ethoxyphenyl, 3-ethoxyphenyl, 4-ethoxyphenyl, 2,4-diethoxyphenyl, 3,5-diethoxyphenyl, 2,6-diethoxyphenyl, 2,4,6-triethoxyphenyl, 2-propoxyphenyl, 3-propoxyphenyl, 4-propoxyphenyl, 2,4-dipropoxyphenyl, 3,5-dipropoxyphenyl, 2,6-dipropoxyphenyl, 2-isopropoxyphenyl, 3-isopropoxyphenyl, 4-isopropoxyphenyl, 2,4-diisopropoxyphenyl, 2,6-diisopropoxyphenyl, 2-butoxyphenyl, 3-butoxyphenyl, and 4-butoxyphenyl; 2-chlorophenyl, 3-chlorophenyl, 4-chlorophenyl, 2,4-dichlorophenyl, 3,5-dichlorophenyl, and 2,6-dichlorophenyl; 2-hydroxyphenyl, 3-hydroxyphenyl, 4-hydroxyphenyl, 2,4-dichlorophenyl, 3,5-dichlorophenyl, and 2,6-dichlorophenyl; 2-hydroxyphenyl, 3-hydroxyphenyl, 4-hydroxyphenyl, 2,4-dihydroxyphenyl, 3,5-dihydroxyphenyl, and 2,6-dihydroxyphenyl; 2-cyanophenyl, 3-cyanophenyl, and 4-cyanophenyl; 3-carboxyphenyl and 4-carboxyphenyl; 3-carboxyamidophenyl, 4-carboxyamidophenyl, 3-N-methylcarboxamidophenyl, 4-N-methylcarboxamidophenyl, 3-N-ethylcarboxamidophenyl, and 4-N-ethylcarboxamidophenyl; 3-acetylaminophenyl, 4-acetylaminophenyl, 3-propionylaminophenyl, 4-propionylaminophenyl, 3-butyrylaminophenyl, and 4-butyrylaminophenyl; 3-phenylaminophenyl, 4-N-phenylaminophenyl, 3-(o-tolyl)aminophenyl, 4-N-(o-tolyl)aminophenyl, 3-(m-tolyl)aminophenyl, 4-N-

(m-tolyl)aminophenyl, 3-(p-tolyl)aminophenyl, and 4-(p-tolyl)aminophenyl; 3-(2-pyridyl)aminophenyl, 4-(2-pyridyl) aminophenyl, 3-(3-pyridyl)aminophenyl, 4-(3-pyridyl) aminophenyl, 3-(4-pyridyl)aminophenyl, 4-(4-pyridyl) aminophenyl, 3-(2-pyrimidyl)aminophenyl, 4-(2-pyrimidyl) aminophenyl, and 4-(4-pyrimidyl)aminophenyl; 4-phenylazophenyl, 4-(1-naphthylazo)phenyl, 4-(2-naphthylazo)phenyl, 4-(4-naphthylazo)phenyl, 4-(2-pyridylazo)phenyl, 4-(3-pyridylazo)phenyl, 4-(4-pyridylazo)phenyl, 4-(2-pyrimidylazo)phenyl, 4-(4-pyrimidylazo)phenyl and 4-(5-pyrimidylazo)phenyl; and phenoxy, phenylthio, 2-naphthoxy, 2-naphthylthio, 2-pyridyloxy, 3-pyridyloxy, 4-pyridyloxy, 2-pyridylthio, 3-pyridylthio, 4-pyridylthio, 2-pyrimidyloxy, 4-pyrimidyloxy, 5-pyrimidyloxy, 2-pyrimidylthio, 4-pyrimidylthio, and 5-pyrimidylthio.

A polymer, co-polymer, or a homopolymer, among others that can include one or more of a monomer such as, but not limited to, a monomer selected from one of: each of the Formula I monomers described herein and combinations thereof.

A device, among others, that can include one or more of a monomer such as, but not limited to, a monomer selected from one of: each of the Formula I monomers described herein and combinations thereof.

A polymer layer, among others, that can include one or more of a monomer such as, but not limited to, a monomer selected from one of: each of the Formula I monomers described herein and combinations thereof.

A material, among others, that includes a mixture of components comprising a monomer, a polymer including the monomer, a co-polymer including the monomer, a homopolymer including the monomer, and combinations thereof. The monomer is selected from: the Formula I monomer as disclosed herein. An amount of each monomer present in the mixture is selected to control at least one property of the mixture, where the property is selected from one of: volatility, solubility, crystallinity, melting point, phase transitions, shelf life, charge transport ability, and combinations thereof.

A material, among others, that includes a mixture of components comprising a compound selected from: the Formula I monomer as disclosed herein. An amount of each compound present in the mixture is selected to control at least one property of the mixture, where the property is selected from one of: volatility, solubility, crystallinity, melting point, phase transitions, shelf life, charge transport ability, and combinations thereof.

BRIEF DESCRIPTION OF THE DRAWINGS

Many aspects of the disclosure can be better understood with reference to the following drawings. The components in the drawings are not necessarily to scale, emphasis instead being placed upon clearly illustrating the principles of the present disclosure. Moreover, in the drawings, like reference numerals designate corresponding parts throughout the several views.

FIG. 5 illustrates the first DSC cycle of 3a.

FIG. 6 illustrates the second DSC cycle of 3a.

DETAILED DESCRIPTION

Figure 1:
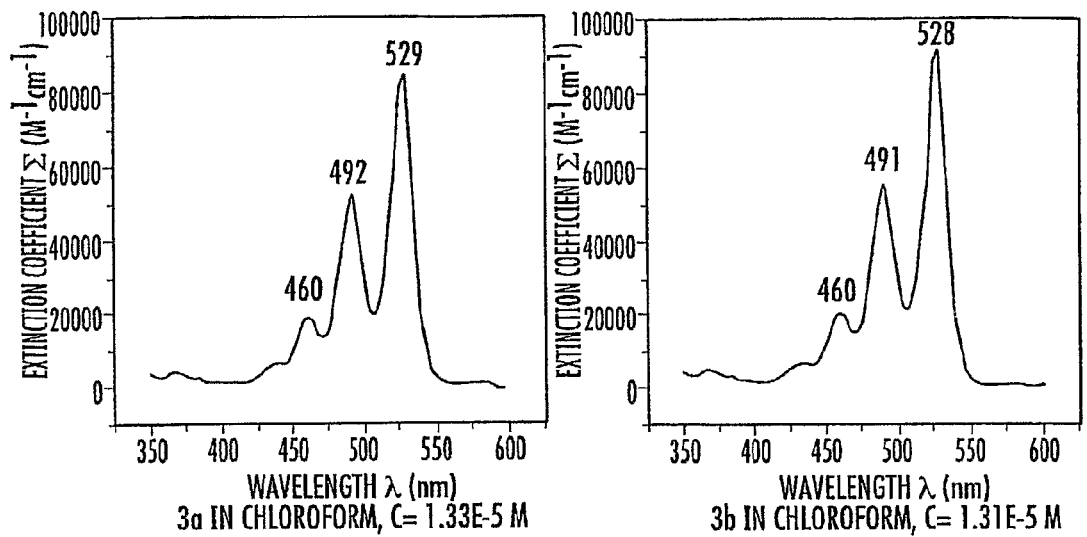
FIG. 1 illustrates the absorption spectra of compound 3a and 3b in chloroform.

In accordance with the purpose(s) of the present disclosure, as embodied and broadly described herein, embodiments of the present disclosure, in one aspect, relate to perylenetetracarboxylic diimide charge-transport materials, methods of making perylenetetracarboxylic diimide charge-transport materials, and methods of using and devices that include perylenetetracarboxylic diimide charge-transport materials. In particular, the perylenetetracarboxylic diimide charge-transport materials include a perylenetetracarboxylic diimide core having side chains (groups or mesogens) attached to the core. In general, perylenetetracarboxylic diimide charge-transport materials have strong intermolecular overlap and low reorganization energies, coupled with the tunability of redox potentials, of glass-, crystal-, and liquid-crystal-forming abilities, of the delocalization of electronic structure, and of the degree of molecular and materials anisotropy. In particular, the side chains of the perylenetetracarboxylic diimide charge-transport cores can be selected to provide charge-transport materials having various volatilities, solubilities, crystallinity, and charge transport ability, as well as being a hole-transport material or an electron-transport material. In other words, the side chains can be selected to tune the characteristics of the perylenetetracarboxylic diimide charge-transport materials as necessary.

The perylenetetracarboxylic diimide charge-transport materials described herein can be used in a wide variety of electronic applications that include, but are not limited to, active electronic components, passive electronic components, electroluminescent (EL) devices (e.g., organic light emitting devices (OLEDs)), photovoltaic cells, light-emitting diodes, field-effect transistors, phototransistors, radio-frequency ID tags, semiconductor devices, photoconductive diodes, metal-semiconductor junctions (e.g., Schottky barrier diodes), p-n junction diodes, p-n-p-n switching devices, photodetectors, optical sensors, phototransducers, bipolar junction transistors (BJTs), heterojunction bipolar translators, switching transistors, charge transfer devices, thin film transistors, organic radiation detectors, infra-red emitters, tunable microcavities for variable output wavelength, telecommunications devices and applications, optical computing devices, optical memory devices, chemical detectors, combinations thereof, and the like.

In addition, the perylenetetracarboxylic diimide charge-transport materials can also be used to modify the surfaces of other material components, with the aim of improving mechanical contact between materials and/or to improve charge-transport from one material to another.

The disclosed perylenetetracarboxylic diimide charge-transport materials can exist as crystals, mesoscopic phases, polymers, glasses, liquids, gases, and combinations thereof. The state of perylenetetracarboxylic diimide charge-transport materials can be altered by processing the perylenetetracarboxylic diimide charge-transport materials, mixing the perylenetetracarboxylic diimide charge-transport materials with other materials, using different side chains in the perylenetetracarboxylic diimide charge-transport materials relative to other perylenetetracarboxylic diimide charge-transport materials, and the like. One skilled in the art could modify embodiments of the present disclosure to alter the state of the perylenetetracarboxylic diimide charge-transport materials.

The perylenetetracarboxylic diimide charge-transport material compounds can be processed to produce a highly ordered mesophase morphology. When the perylenetetracarboxylic diimide charge-transport materials are used to form a layered thin film, the molecules have a preferential orientation in space. In particular, the perylenetetracarboxylic diimide charge-transport materials can have a certain degree of long range orientational molecular order and long range translational molecular order. The mesophase ordering allows close packing of molecular pi-electron systems (e.g., closely packed conjugated aromatic rings, in which very close pi-pi stacking can occur). Pi-pi stacking allows intermolecular charge transport to occur more easily, leading to high charge carrier mobilities, which increases intermolecular charge transfer that occurs through a hopping mechanism between adjacent molecules. In particular, the perylenetetracarboxylic diimide charge-transport material compounds can stack in the form of well-defined columns (e.g., the aromatic cores in one layer are substantially aligned with the aromatic cores in adjacent layers) forming one dimensional paths for charge transport along the stacked conjugated cores due to the good intermolecular overlap within the stacks.

This ordered and oriented microstructure can be made substantially permanent by polymerizing the perylenetetracarboxylic diimide charge-transport materials, which can also create a structure with long-range order, or a "monodomain." Formation of a monodomain also maximizes charge transfer by eliminating charge trap sites at grain boundaries, while the polymerization also improves the mechanical properties of the film. Further, by cross-linking the charge-transport material compounds, a highly stable structure results, which has an additional advantage of being substantially impervious to subsequent processing solvents during device fabrication, thus allowing a wider range of solvents to be used in deposition of the next layer of the device by solution techniques. In addition, cross-linking may increase the density of the film, leading to smaller intermolecular distances and improved charge transport.

The disclosed perylenetetracarboxylic diimide charge-transport materials can be in a liquid crystalline phase or can show liquid crystal phase behavior in mixtures with other compounds. Additionally, when the compounds or materials, or the mixtures thereof, are polymerized, they are in a liquid crystalline phase. As used herein, a "liquid crystalline phase" or "liquid crystal phase" includes a phase that is intermediate to a liquid phase and a crystalline phase. In the liquid crystalline phase, the orientations of a portion of the perylenetetracarboxylic diimide charge-transport material compounds are correlated to each other (e.g., the orientation of each individual perylenetetracarboxylic diimide charge-transport material compound is affected and is affecting the orientation of the neighboring perylenetetracarboxylic diimide charge-transport material compound), and the correlation can extend to a large scale (e.g., equal to or larger than 1 micron so that a substantial portion of the perylenetetracarboxylic diimide charge-transport material compounds are orientated (e.g., the central aromatic cores are substantially aligned in subsequent layers to form a one-dimensional column for charge transport). The orientation-correlation in the liquid crystals allows one to control the orientations of the perylenetetracarboxylic diimide charge-transport material compounds with the aid of an electrical field, a magnetic field, or a pre-treated surface, so that one can switch the orientation or diminish the unwanted effect of the local environment (e.g., impurities). This is unlike an isotropic phase where the orientations of transition-metal charge-transport material compounds in solution are random.

The alignment of the molecules of the liquid crystals is conventionally regarded as being alignment with respect to a vector called the director. Unlike in the solid phase, in the crystalline state the positions of the molecules in the liquid crystal phase do not have long-range order in at least one direction. For example, discotic liquid-crystalline mesophases include quasi-two-dimensional molecules, which include a rigid conjugated core and flexible side chains (e.g., perylenetetracarboxylic diimide charge-transport molecules). The perylenetetracarboxylic diimide charge-transport material compounds in the discotic liquid-crystalline mesophase can stack in the form of well-defined columns, forming one dimensional paths for charge transport along the stacked conjugated cores due to the good intermolecular overlap within the stacks.

Alignment of the liquid crystal material can be achieved, for example, by application of a magnetic and/or electric field (e.g., oscillating electro-magnetic radiation), by treatment of the substrate onto which the material is coated, by shearing the material during or after coating, by application of a magnetic and/or electric field (e.g., oscillating electro-magnetic radiation) to the coated material, or by the addition of surface-active compounds to the liquid crystal material. Reviews of alignment techniques are given for example by I. Sage in "Thermotropic Liquid Crystals", edited by G. W. Gray, John Wiley & Sons, 1987, pages 75-77, and by T. Uchida and H. Seki in "Liquid Crystals—Applications and Uses Vol. 3", edited by B. Bahadur, World Scientific Publishing, Singapore 1992, pages 1-63. A review of alignment materials and techniques is given by J. Cognard, Mol. Cryst. Liq. Cryst. 78, Supplement. (1981), pages 1-77.

Embodiments of compounds of the perylenetetracarboxylic diimide charge-transport materials are represented by Formula (I):

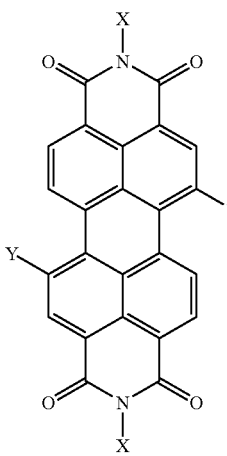

Formula I

The perylenetetracarboxylic diimide charge-transport materials having Formula I are monomer units in a polymer of the charge-transport material, such as a homopolymer or a copolymer (e.g., block copolymers, random copolymers, alternating copolymers, periodic copolymers, and combinations thereof). The monomer units in embodiments of the copolymers can include perylenetetracarboxylic diimide charge-transport materials having Formula I, as well as other monomer units consistent with the purposes and characteristics of the charge-transport materials described herein.

Various groups (e.g., atoms and compounds) or mesogenic units can be bonded to the perylenetetracarboxylic diimide charge-transport materials having Formula I to form a variety of charge-transport materials. The type of group and/or the combinations of groups that can be bonded to perylenetetracarboxylic diimide charge-transport materials having Formula I can be selected to tune the volatility, solubility, crystallinity, and charge transport ability, of the charge-transport material. In addition, the type of group and/or the combinations of groups that can be bonded to the perylenetetracarboxylic diimide charge-transport materials having Formula I can be selected from a hole-transport material or an electron-transport material.

In perylenetetracarboxylic diimide charge-transport materials having Formula I, an asterisk (*) in the structures shown below identifies the atom of attachment to a functional group and implies that the atom is missing one hydrogen that would normally be implied by the structure in the absence of the asterisk. Also note the following: "—" indicates a single bond between 2 atoms, "=" indicates a double bond between 2 atoms, and "≡" indicates a triple bond between 2 atoms.

In Formula I, the groups can include from one type of group to multiple types of groups depending on the particular charge-transport material. It should also be noted that the configuration (e.g., position on the molecule) of the groups on the molecules can vary depending on the number of different groups bonded to the molecules to produce charge-transport materials having a particular characteristic.

X in each instance can be independently selected from, but is not limited to: 3,4,5-trialkoxyphenyl; 3,4,5-trialkylphenyl; 3,4,5-tri-perfluorinated-alkylphenyl; 3,4,5-tri-perfluorinated-alkoxyphenyl; 3,4,5-tri-oligomeric-ether-substituted phenyl; 3,4,5-trialkoxybenzyl; 3,4,5-trialkylbenzyl; 3,4,5-tri-perfluorinated-alkyl benzyl; 3,4,5-tri-perfluorinated-alkoxy benzyl; 3,4,5-tri-oligomeric-ether-substituted benzyl; 3,4-dialkoxyphenyl, 3,4-dialkylphenyl; 3,4-di-perfluorinated-alkylphenyl; 3,4-di-perfluorinated-alkoxyphenyl; 3,4-di-oligomeric-ether-substituted phenyl; 3,4-dialkoxybenzyl; 3,4-dialkylbenzyl; 3,4-di-perfluorinated-alkylbenzyl; 3,4-di-perfluorinated-alkoxybenzyl; 3,4-di-oligomeric-ether-substituted benzyl; 3,5-dialkoxyphenyl; 3,5-dialkylphenyl; 3,5-di-perfluorinated-alkyl phenyl; 3,5-di-perfluorinated-alkoxy phenyl; 3,5-di-oligomeric-ether-substituted phenyl; 3,5-dialkoxybenzyl; 3,5-dialkylbenzyl; 3,5-di-perfluorinated-alkyl benzyl; 3,5-di-oligomeric-ether-substituted benzyl; or the following units:

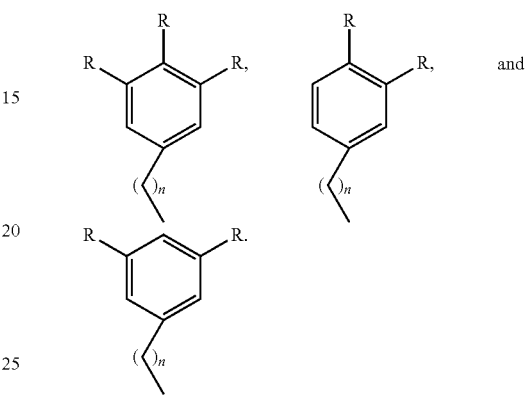

R in each instance can be independently selected from, but is not limited to: an alkyl, an alkoxy, a perfluorinated alkyl, a perfluorinated alkoxy, an oligomeric-ether. Also, R may denote units that can form dendrimers. Subscript n is a number from 0 to 20. In addition, R can be a polymerizable group as described below.

Also X in each instance is independently selected from: H; linear or branched; alkyl groups with up to 25 carbons; linear or branched, perfluorinated alkyl groups with up to 25 carbons; fused aromatic rings; donor groups; acceptor groups; aryl groups; polymerizable groups; —$(CH_2CH_2O)_\alpha$—$(CH_2)_\beta$ OR$_{a1}$; —$(CH_2CH_2O)_\alpha$—$(CH_2)_\beta$NR$_{a2}$R$_{a3}$; —$(CH_2CH_2O)_\alpha$—$(CH_2)_\beta$CONR$_{a2}$R$_{a3}$; —$(CH_2CH_2O)_\alpha$—$(CH_2)_\beta$CN; —$(CH_2CH_2O)_\gamma$—$(CH_2)_\delta$F; —$(CH_2CH_2O)_\gamma$—$(CH_2)_\delta$NO$_2$; —$(CH_2CH_2O)_\alpha$—$(CH_2)_\beta$Cl; —$(CH_2CH_2O)_\alpha$—$(CH_2)_\beta$Br; —$(CH_2CH_2O)_\alpha$—$(CH_2)_\beta$I; —$(CH_2CH_2O)_\alpha$—$(CH_2)_\beta$-Phenyl; —$CH_2$—$(CH_2)_\beta$—$(OCH_2CH_2)_\alpha$R$_{a1}$; —$CH_2$—$(CH_2)_\beta$—$(OCH_2CH_2)_\alpha$NR$_{a2}$R$_{a3}$; —$(CH_2)_\beta$CH$_2$—$(OCH_2CH_2)_\alpha$ CONR$_{a2}$R$_{a3}$; —$CH_2$—$(CH_2)_\beta$—$(OCH_2CH_2)_\alpha$ CN; —$CH_2$—$(CH_2)_\beta$—$(OCH_2CH_2)_\alpha$F; —$CH_2$—$(CH_2)_\beta$—$(OCH_2CH_2)_\alpha$NO$_2$; —$CH_2$—$(CH_2)_\beta$—$(OCH_2CH_2)_\alpha$Cl; —$CH_2$—$(CH_2)_3$—$(OCH_2CH_2)_\alpha$Br; —$CH_2$—$(CH_2)_\beta$—$(OCH_2CH_2)_\alpha$I; —$CH_2(CH_2)_\beta$—$(OCH_2CH_2)_\alpha$Phenyl; —$CF_2$—$(CF_2)_\beta$OR$_{a1}$; —$CF_2$—$(CF_2)_\beta$CH$_2$NR$_{a2}$R$_{a3}$; —$(CF_2)_\beta$CF$_3$; —$(CF_2)_\beta$OR$_{a1}$; —$CH_2CH_2(CF_2)_\beta$OR$_{a1}$; —$CH_2CH_2(CF_2)_\beta$CH$_2$NR$_{a2}$R$_{a3}$; $(CF_2)_\beta$CH$_2$NR$_{a2}$R$_{a3}$; —$CH_2CH_2(CF_2)_\beta$CF$_3$; —$CH_2$—$(CH_2)_\beta$—$(OCH_2CH_2)_\alpha$Phenyl; —$CF_2$—$(CF_2)_\beta$—$(OCH_2CH_2)_\alpha$ Phenyl; —$CH_2$—$(CH_2)_\beta$—$(OCH_2CH_2)_\alpha$Aryl; —$CF_2$—$(CF_2)_{13}$—$(OCH_2CH_2)_\alpha$Aryl; —$CH_2CH_2$—$(OCH_2CH_2)_\alpha$—O$(CF_2)_\beta$ Aryl; —$CH_2CH_2$—$(OCH_2CH_2)_\alpha$—O$(CH_2)_\beta$Aryl; —$CH_2$—O—$(CH_2)_\beta$Aryl; and —$(CF_2)_\beta$Aryl; and combinations thereof.

In addition, groups X can each be independently selected from, but not limited to, one or more of the following groups: —$(CH_2CH_2O)_\alpha$—$(CH_2)_\beta$CH$_2$OR$_{a1}$; —$(CH_2CH_2O)_\alpha$—$(CH_2)_\beta$CH$_2$NR$_{a2}$R$_{a3}$; —$(CH_2CH_2O)_\alpha$—$(CH_2)_\beta$ CONR$_{a2}$R$_{a3}$; —$(CH_2CH_2O)_\alpha$—$(CH_2)_\beta$CH$_2$CN; —$(CH_2CH_2O)_\gamma$—$(CH_2)_\delta$CH$_2$F —$(CH_2CH_2O)_\gamma$—$(CH_2)_5$ $CH_2NO_2$—$(CH_2CH_2O)_\alpha$—$(CH_2)_\beta CH_2Cl$; —$(CH_2CH_2O)_\alpha$—$(CH_2)_\beta CH_2Br$; —$(CH_2CH_2O)_\alpha$—$(CH_2)_\beta CH_2I$; —$(CH_2CH_2O)_\alpha$—$(CH_2)_\beta$-Phenyl; —$CH_2$—$(CH_2)_\beta$—$(OCH_2CH_2)_\alpha OR_{a1}$; —$CH_2$—$(CH_2)_\beta$—$(OCH_2CH_2)_\alpha SR_{a1}$; —$CH_2$—$(OCH_2CH_2)_\alpha$—$(CH_2)_\beta SR_{a1}$; —$CH_2$—$(CH_2)_\beta$—$(OCH_2CH_2)_\alpha P(O)(OR_{a1})_2$; —$CH_2$—$(OCH_2CH_2)_\alpha$—$(CH_2)_\beta$—$P(O)(OR_{a1})_2$; —$CH_2$—$(OCH_2CH_2)_\alpha$—$(CH_2)_\beta SR_{a1}$; —$CH_2$—$(CH_2)_\beta$—$(OCH_2CH_2)_\alpha NR_{a2}R_{a3}$; —$(CH_2)_\beta CH_2$—$(OCH_2CH_2)_\alpha CONR_{a2}R_{a3}$; —$CH_2$—$(CH_2)_\beta$—$(OCH_2CH_2)_\alpha CN$; —$CH_2$—$(CH_2)_\beta$—$(OCH_2CH_2)_\alpha F$; —$CH_2$—$(CH_2)_\beta$—$(OCH_2CH_2)_\alpha NO_2$; —$CH_2$—$(CH_2)_\beta$—$(OCH_2CH_2)_\alpha Cl$; —$CH_2$—$(CH_2)_\beta$—$(OCH_2CH_2)_\alpha Br$; —$CH_2$—$(CH_2)_\beta$—$(OCH_2CH_2)_{a1}$; —$CH_2$—$(CH_2)_\beta$—$(OCH_2CH_2)_\alpha Phenyl$; —$CF_2$—$(CF_2)_\beta OR_{a1}$; —$CF_2$—$(CF_2)_\beta CH_2NR_{a2}R_{a3}$; —$(CF_2)_\beta CF_3$; —$(CF_2)_\beta OR_{a1}$; —$CH_2CH_2(CF_2)_\beta OR_{a1}$; —$CH_2CH_2(CF_2)_\beta CH_2NR_{a2}R_{a3}$; —$(CF_2)_\beta CH_2NR_{a2}R_{a3}$; —$CH_2CH_2(CF_2)_\beta CF_3$; —$CH_2$—$(CH_2)_\beta$—$(OCH_2CH_2)_\alpha Phenyl$; —$CF_2$—$(CF_2)_\beta$—$(OCH_2CH_2)_\alpha$ Phenyl; —$CH_2$—$(CH_2)_\beta$—$(OCH_2CH_2)_\beta Aryl$; —$CF_2$—$(CF_2)_\beta$—$(OCH_2CH_2)_\alpha$ Aryl (see discussion below); —$CH_2CH_2$—$(OCH_2CH_2)_\alpha$—$O(CF_2)_\beta Aryl$ (see discussion below); -Aryl; $CH_2CH_2$—$(OCH_2CH_2)_\alpha$—$O(CH_2)_\beta Aryl$ (see discussion below); —$CH_2$—$O$—$(CH_2)_\beta Aryl$ (see discussion below); and —$(CF_2)_\beta Aryl$ (see discussion below).

$R_{a1}$, $R_{a2}$, and $R_{a3}$ can each be independently selected from, but not limited to, one or more of the following groups: H, linear or branched, alkyl groups with up to 25 carbons (e.g., 0, 1, 2, 3, 4, 5, 6, 7, 8, 9, 10, 11, 12, 13, 14, 15, 16, 17, 18, 19, 20, 21, 22, 23, 24, 25 carbons in all isomer forms such as normal, secondary, iso- and neo-isomers), and a functional group derived from amino acids, nucleic acids, biotin, ferrocene, ruthenocene, cyanuric chloride, methacryloyl chloride, and derivatives thereof. Subscript $\alpha$ is an integer number from 0 to 25 (e.g., 0, 1, 2, 3, 4, 5, 6, 7, 8, 9, 10, 11, 12, 13, 14, 15, 16, 17, 18, 19, 20, 21, 22, 23, 24, and 25). Subscript $\beta$ is an integer number from 0 to 25 (e.g., 0, 1, 2, 3, 4, 5, 6, 7, 8, 9, 10, 11, 12, 13, 14, 15, 16, 17, 18, 19, 20, 21, 22, 23, 24, and 25).

The aryl group can include aromatic ring systems having up to 20 carbons in the aromatic ring framework (e.g., 0, 1, 2, 3, 4, 5, 6, 7, 8, 9, 10, 11, 12, 13, 14, 15, 16, 17, 18, 19, and 20 carbons in all isomer forms), (e.g., does not include carbons on the substituents). The aryl group can include, but is not limited to the following structures:

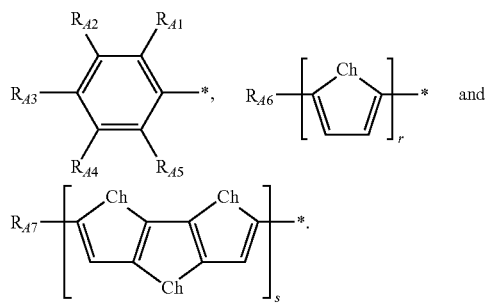

It should be noted that Ch can be an atom such as, but not limited to, Se, S, O, and a combination thereof when more than one Ch is present in the aryl ring system. $R_{A1}$, $R_{A2}$, $R_{A3}$, $R_{A4}$, $R_{A5}$, $R_{A6}$, $R_{A7}$, can each be independently selected from, but not limited to, the following groups: H; a linear or branched alkyl group with up to 25 carbons (e.g., 0, 1, 2, 3, 4, 5, 6, 7, 8, 9, 10, 11, 12, 13, 14, 15, 16, 17, 18, 19, 20, 21, 22, 23, 24, and 25 carbons in all isomer forms such as normal, secondary, iso- and neo-isomers); —$(CH_2CH_2O)_\gamma$—$(CH_2)_\delta$ $OCH_3$; —$(CH_2CH_2O)_\gamma$—$(CH_2)_\delta M(CH_3)_2$; $(CH_2CH_2O)_\gamma$—$(CH_2)_\delta CON(CH_3)_2$; —$(CH_2CH_2O)_\gamma$—$(CH_2)_\delta CN$; —$(CH_2CH_2O)_\gamma$—$(CH_2)_\delta F$; —$(CH_2CH_2O)_\gamma$—$(CH_2)_\delta NO_2$; —$(CH_2CH_2O)_\gamma$—$(CH_2)_\delta O$; —$(CH_2CH_2O)_\gamma$—$(CH_2)_\delta Br$; —$(CH_2CH_2O)_\gamma$—$(CH_2)_\delta$; —$(CH_2CH_2O)_\gamma$—$(CH_2)_\delta$-Phenyl; —$(CH_2)_\delta$—$(OCH_2CH_2)_\gamma CH_3$; —$(CH_2)_\delta$—$(OCH_2CH_2)_\delta N(CH_3)_2$; —$(CH_2)_\delta$—$(OCH_2CH_2)_\gamma CON(CH_3)_2$; —$(CH_2)_\delta$—$(OCH_2CH_2)_\gamma CN$; —$(CH_2)_\delta$—$(OCH_2CH_2)_\gamma F$; $(CH_2)_\delta$—$(OCH_2CH_2)_\alpha NO_2$; —$(CH_2)_\delta$—$(OCH_2CH_2)_\gamma Cl$; —$(CH_2)_\delta$—$(OCH_2CH_2)_\gamma Br$; —$(CH_2)_\delta$—$(OCH_2CH_2)_\gamma I$; —$(CH_2)_\delta$—$(OCH_2CH_2)_\gamma$-Phenyl; —$(CF_2)_\beta OCH$; —$(CF_2)_\beta OCH$; —$(CH_2)_\beta CH_2 ON(CH_3)_2$; —$(CF_2)_\beta CH_3$; —$O(CH_2)_\alpha OCH_3$; —$OCH_2CH_2(CH_2)_\beta OCH_3$; —$OCH_2CH_2(CF_2)_\beta CH_2N(CH_3)_2$; —$O(CF_2)_\beta CH_2N(CH_3)_2$; —$OCH_2CH_2(CF_2)_\beta CF_3$; —$(CH_2)_{13}$—$(OCH_2CH_2)_\alpha Phenyl$; and —$(CF_2)_\beta$—$(OCH_2CH_2)_\alpha Phenyl$.

The subscript $\gamma$ is an integer number from 0 to 25 (e.g., 0, 1, 2, 3, 4, 5, 6, 7, 8, 9, 10, 11, 12, 13, 14, 15, 16, 17, 18, 19, 20, 21, 22, 23, 24, and 25). The subscript $\delta$ is an integer number from 0 to 25 (e.g., 0, 1, 2, 3, 4, 5, 6, 7, 8, 9, 10, 11, 12, 13, 14, 15, 16, 17, 18, 19, 20, 21, 22, 23, 24, and 25). The subscript r is an integer number from 0 to 6 (e.g., 0, 1, 2, 3, 4, 5, and 6). The subscript s is an integer number from 0 to 3 (e.g., 0, 1, 2, and 3).

The polymerizable group (functionalities) can include, but is not limited to, vinyl, allyl, 4-styryl, acroyl, epoxide, oxetane, cyclic-carbonate, methacroyl, and acrylonitrile, each of which may be polymerized by either a radical, cationic, atom transfer, or anionic polymerization process.

In addition, the polymerizable group can include, but is not limited to, isocyanate, isothiocyanate, and epoxides, such that they can be copolymerized with difunctional amines or alcohols such as $HO(CH_2)_x OH$, $H_2N(CH_2)_x NH_2$, where $x$ is an integer number from 0 to 25 (e.g., 0, 1, 2, 3, 4, 5, 6, 7, 8, 9, 10, 11, 12, 13, 14, 15, 16, 17, 18, 19, 20, 21, 22, 23, 24, and 25).

Also the polymerizable group can include, but is not limited to, strained ring olefins such as, but not limited to, dicyclopentadienyl, norbornenyl, and cyclobutenyl. Such monomers can be polymerized via ring opening metathesis polymerization using an appropriate metal catalyst, as would be known to those skilled in the art.

Further, the polymerizable group can include, but is not limited to, $(—CH_2)_n SiCl_3$, $(—CH_2)_n Si(OCH_2CH_3)_3$, or $(—CH_2)_n Si(OCH_3)_3$, where the monomers can be reacted with water under conditions known to those skilled in the art to form either thin film or monolithic organically modified sol-gel glasses, or modified silicated surfaces, where $n$ is an integer number from 0 to 25 (e.g., 0, 1, 2, 3, 4, 5, 6, 7, 8, 9, 10, 11, 12, 13, 14, 15, 16, 17, 18, 19, 20, 21, 22, 23, 24, and 25).

Furthermore, the polymerizable group can include, but is not limited to, polymerizable groups that can be photochemically dimerized or polymerized, and these include the following structures:

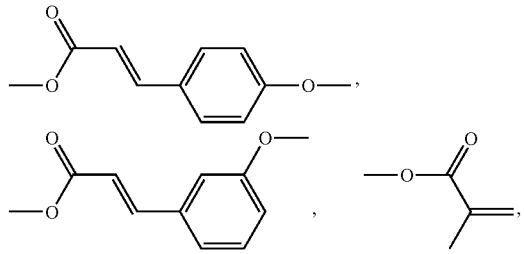

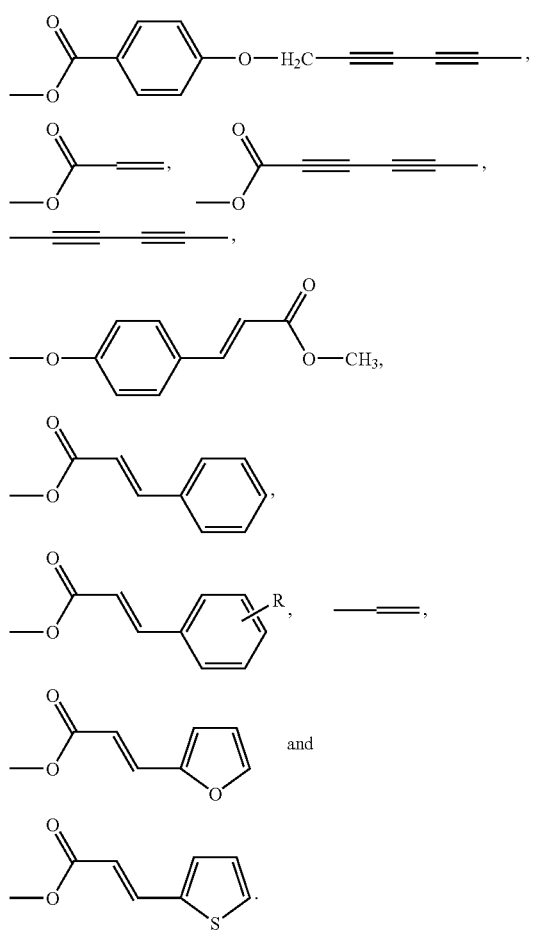
The acceptors can include structures such as, but not limited to, the following:
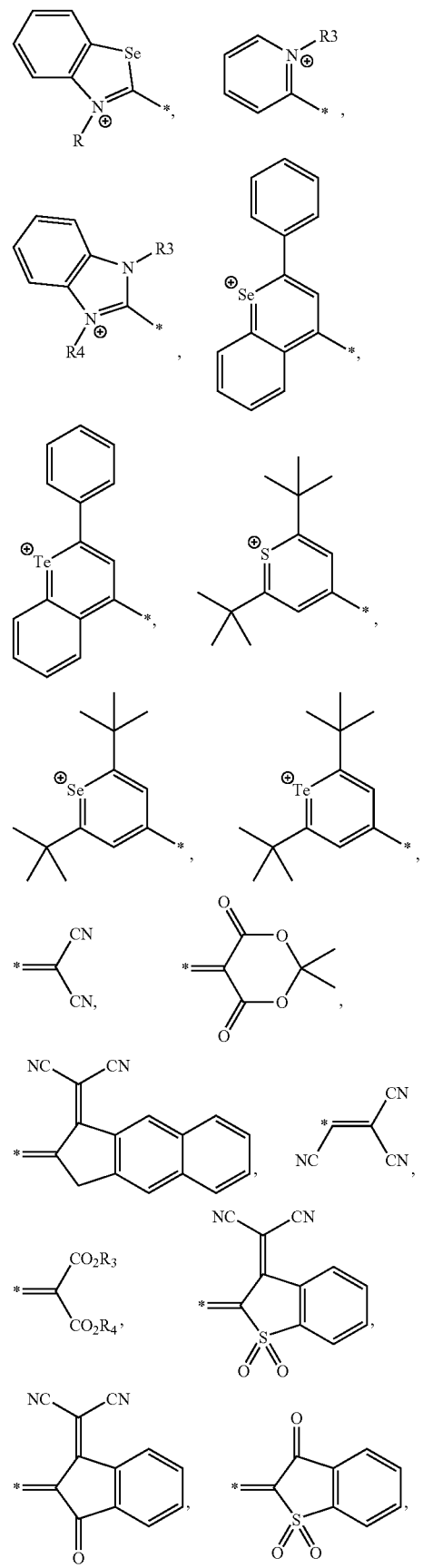

-continued

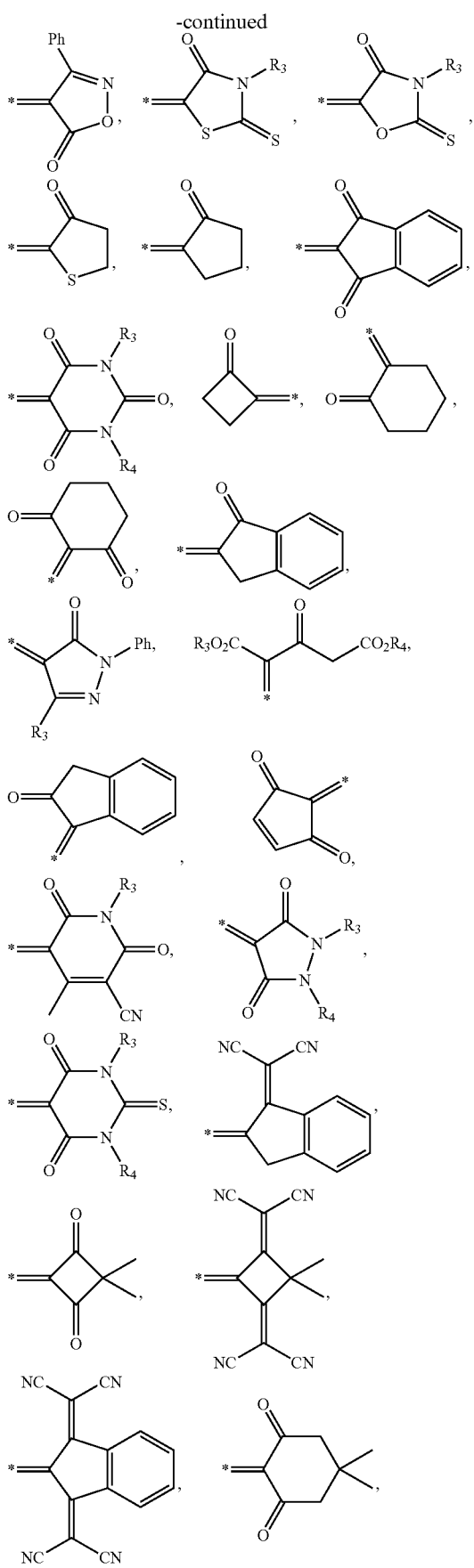

-continued

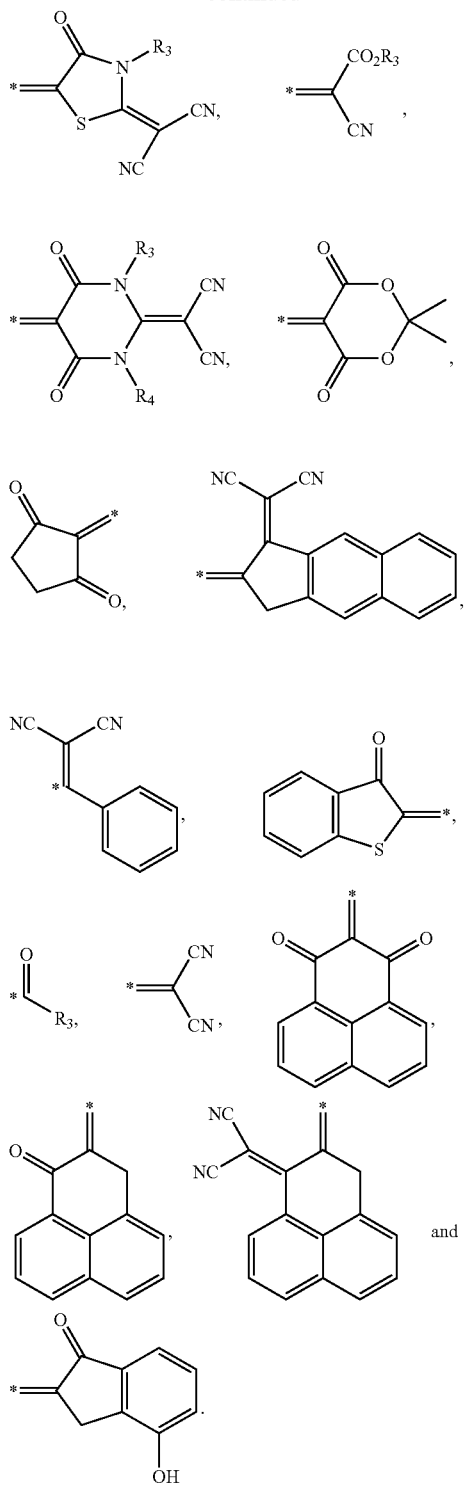

Y in each instance can be independently selected from, but is not limited to: H, CN, and acceptors (as described herein). In an exemplary embodiment, Y in each instance can be independently selected from an acceptor. In addition the acceptor can be of the form; —C≡C-aryl, —(C≡C)-$_2$aryl; —(C≡C)-$_3$aryl; —HC═CH-aryl; —(HC═CH)$_2$-aryl; and —(HC═CH)$_3$-aryl. In addition, Y can be a polymerizable group as described above.

The aryl group can include, but is not limited to the following structures:

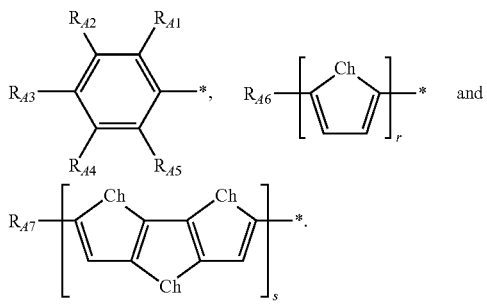

It should be noted that Ch can be an atom such as, but not limited to, Se, S, O, and a combination thereof when more than one Ch is present in the aryl ring system. $R_{A1}$, $R_{A2}$, $R_{A3}$, $R_{A4}$, $R_{A5}$, $R_{A6}$, $R_{A7}$, can each be independently selected from, but not limited to, the following groups: H; a linear or branched alkyl group with up to 25 carbons (e.g., 0, 1, 2, 3, 4, 5, 6, 7, 8, 9, 10, 11, 12, 13, 14, 15, 16, 17, 18, 19, 20, 21, 22, 23, 24, and 25 carbons in all isomer forms such as normal, secondary, iso- and neo-isomers); —$(CH_2CH_2O)_\alpha$—$(CH_2)_\beta$ $OR_{b1}$; —$(CH_2CH_2O)_\alpha$—$(CH_2)_\beta NR_{b2}R_{b3}$; —$(CH_2CH_2O)_\alpha$ —$(CH_2)_\beta CONR_{b2}R_{b3}$; —$(CH_2CH_2O)_\gamma$—$(CH_2)_\delta OCH_3$; —$(CH_2CH_2O)_\gamma$—$(CH_2)_\delta N(CH_3)_2$; —$(CH_2CH_2O)_\gamma$—$(CH_2)_\delta$ $CON(CH_3)_2$; —$(CH_2CH_2O)_\gamma$—$(CH_2)_\delta CN$; —$(CH_2CH_2O)_\gamma$—$(CH_2)_\delta F$; —$(CH_2CH_2O)_\gamma$—$(CH_2)_\delta NO_2$; —$(CH_2CH_2O)_\gamma$—$(CH_2)_\delta Cl$; —$(CH_2CH_2O)_\gamma$—$(CH_2)_\delta Br$; —$(CH_2CH_2O)_\gamma$—$(CH_2)_\delta I$; —$(CH_2CH_2O)_\gamma$—$(CH_2)_\delta$-Phenyl; —$(CH_2)_\delta$—$(OCH_2CH_2)_\gamma CH_3$; —$(CH_2)_\delta$—$(OCH_2CH_2)_\delta$ $N(CH_3)_2$; —$(CH_2)_\delta$—$(OCH_2CH_2)_\gamma CON$ $(CH_3)_2$; —$(CH_2)_\delta$—$(OCH_2CH_2)_\gamma CN$; —$(CH_2)_\delta$—$(OCH_2CH_2)_\gamma F$; —$(CH_2)_\delta (OCH_2CH_2)_\alpha NO_2$; —$(CH_2)_\delta$—$(OCH_2CH_2)_\gamma Cl$; —$(CH_2)_\delta$—$(OCH_2CH_2)_{\gamma BR}$; —$_{(CH2)\delta}$—$(OCH_2CH_2)_\gamma I$; —$(CF_2)_\beta CF_3$; —$O(CF_2)_\beta OCH_3$; —$OCH_2CH_2(CF_2)_\beta OCH_3$; —$(CH_2)_\delta$—$(OCH_2CH_2)_\gamma$Phenyl; —$(CF_2)_\beta OCH_3$; —$(CF_2)_\beta OCH_3$; —$(CF_2)_\beta CH_2ON$ $(CH_3)_2$; —$(CF_2)_\beta CF_3$; —$O(CF_2)_\beta OCH_3$; —$OCH_2CH_2$ $(CF_2)_\beta$ $OCH_3$; —$OCH_2CH_2(CF_2)_\beta CH_2N$ $(CH_3)_2$; —$O(CF_2)_\beta CH_2N(CH_3)_2$; —$OCH_2CH_2(CF_2)_\beta CF_3$; —$(CH_2)_\beta$—$(OCH_2CH_2)_\alpha$Phenyl; and —$(CF_2)_\beta$—$(OCH_2CH_2)_\alpha$Phenyl; —$(OCH_2CH_2)_\alpha$Aryl'; —$CF_2$—$(CF_2)_\beta$—$(OCH_2CH_2)_\alpha$Aryl' (see discussion below); —$CH_2CH_2$—$(OCH_2CH_2)_\alpha$—$O(CF_2)_\beta$, Aryl' (see discussion below); -Aryl'; $CH_2CH_2$—$(OCH_2CH_2)_\alpha$—$O(CH_2)_\beta$Aryl' (see discussion below); —$CH_2$—$O$—$(CH_2)_\beta$Aryl'; (see discussion below); and —$(CF_2)_\beta$Aryl' (see discussion below).

The subscript $\gamma$ is an integer number from 0 to 25 (e.g., 0, 1, 2, 3, 4, 5, 6, 7, 8, 9, 10, 11, 12, 13, 14, 15, 16, 17, 18, 19, 20, 21, 22, 23, 24, and 25). The subscript $\delta$ is an integer number from 0 to 25 (e.g., 0, 1, 2, 3, 4, 5, 6, 7, 8, 9, 10, 11, 12, 13, 14, 15, 16, 17, 18, 19, 20, 21, 22, 23, 24, and 25). The subscript r is an integer number from 0 to 6 (e.g., 0, 1, 2, 3, 4, 5, and 6). The subscript s is an integer number from 0 to 3 (e.g., 0, 1, 2, and 3).

$R_{b1}$, $R_{b2}$, and $R_{b3}$ can each be independently selected from, but not limited to, one or more of the following groups: H, linear or branched, alkyl groups with up to 25 carbons (e.g., 0, 1, 2, 3, 4, 5, 6, 7, 8, 9, 10, 11, 12, 13, 14, 15, 16, 17, 18, 19, 20, 21, 22, 23, 24, 25 carbons in all isomer forms such as normal, secondary, iso- and neo-isomers), and a functional group derived from amino acids, nucleic acids, biotin, ferrocene, ruthenocene, cyanuric chloride, methacryloyl chloride, and derivatives thereof; —$(CH_2)_\beta OCH_3$; —$CH_2$—$(OCH_2CH_2)_\alpha$ Aryl"; —$CH_2$—$(CF_2)_\beta$—$(OCH_2CH_2)_\alpha$Aryl" (see discussion below); —$CH_2CH_2$—$(OCH_2CH_2)_\alpha$—$O(CF_2)_\beta$Aryl" (see discussion below); -Aryl"; $CH_2CH_2$—$(OCH_2CH_2)_\alpha$—$O$ $(CH_2)_\beta$Aryl" (see discussion below); —$CH_2$—$O$—$(CH_2)_\beta$ Aryl" (see discussion below); —$(CH_2)_\beta$Aryl" (see discussion below); and —$(CF_2)_\beta$Aryl" (see discussion below). Subscript a is an integer number from 0 to 25 (e.g., 0, 1, 2, 3, 4, 5, 6, 7, 8, 9, 10, 11, 12, 13, 14, 15, 16, 17, 18, 19, 20, 21, 22, 23, 24, and 25). Subscript $\beta$ is an integer number from 0 to 25 (e.g., 0, 1, 2, 3, 4, 5, 6, 7, 8, 9, 10, 11, 12, 13, 14, 15, 16, 17, 18, 19, 20, 21, 22, 23, 24, and 25).

The aryl group (e.g., Aryl' and Aryl") can include aromatic ring systems having up to 20 carbons in the aromatic ring framework (e.g., 0, 1, 2, 3, 4, 5, 6, 7, 8, 9, 10, 11, 12, 13, 14, 15, 16, 17, 18, 19, and 20 carbons in all isomer forms), (e.g., does not include carbons on the substituents). The aryl group can include, but is not limited to the following structures:

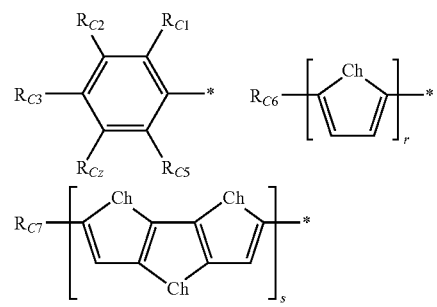

It should be noted that Ch can be an atom such as, but not limited to, Se, S, O, and a combination thereof when more than one Ch is present in the aryl ring system. $R_{C1}$, $R_{C2}$, $R_{C3}$, $R_{C4}$, $R_{C5}$, $R_{C6}$, $R_{C7}$, can each be independently selected from, but not limited to, the following groups: H; a linear or branched alkyl group with up to 25 carbons (e.g., 0, 1, 2, 3, 4, 5, 6, 7, 8, 9, 10, 11, 12, 13, 14, 15, 16, 17, 18, 19, 20, 21, 22, 23, 24, and 25 carbons in all isomer forms such as normal, secondary, iso- and neo-isomers); —$(CH_2CH_2O)_\gamma$—$(CH_2)_\delta$ $OCH_3$; —$(CH_2CH_2O)_\gamma$—$(CH_2)_\delta N(CH_3)_2$; —$(CH_2CH_2O)_\gamma$ —$(CH_2)_\delta CON(CH_3)_2$; —$(CH_2CH_2O)_\gamma$—$(CH_2)_\delta CN$; —$(CH_2CH_2O)_\gamma$—$(CH_2)_\delta F$; —$(CH_2CH_2O)_\gamma$—$(CH_2)_\delta NO_2$; —$(CH_2CH_2O)_\gamma$—$(CH_2)_\delta Cl$; —$(CH_2CH_2O)_\gamma$—$(CH_2)_\delta Br$; —$(CH_2CH_2O)_\gamma$—$(CH_2)_\delta I$; —$(CH_2CH_2O)_\gamma$—$(CH_2)_\delta$-Phenyl; —$(CH_2)_\delta$—$(OCH_2CH_2)_\gamma CH_3$; —$(CH_2)_\delta$—$(OCH_2CH_2)_\delta$ $N(CH_3)_2$; —$(CH_2)_\delta$—$(OCH_2CH_2)_\gamma CON$ $(CH_3)_2$; —$(CH_2)_\delta$—$(OCH_2CH_2)_\gamma CN$; —$(CH_2)_\delta$—$(OCH_2CH_2)_\gamma F$; —$(CH_2)_\delta$—$(OCH_2CH_2)_\alpha NO_2$; —$(CH_2)_\delta$—$(OCH_2CH_2)_\gamma Cl$; —$(CH_2)_\delta$—$(OCH_2CH_2)_\gamma Br$; —$(CH_2)_\delta$—$(OCH_2CH_2)_\gamma I$; —$(CH_2)_\delta$—$(OCH_2CH_2)_\gamma$Phenyl; —$(CF_2)_\beta$ $OCH$; —$(CF_2)_\beta OCH$; —$(CF_2)_\beta CH_2ON(CH_3)_2$; —$(CF_2)_\beta$ $CF_3$; —$O(CF_2)_\beta OCH$; —$OCH_2CH_2(CF_2)_\beta OCH$; —$OCH_2CH_2(CF_2)_\beta CH_2N$ $(CH_3)_2$; —$O(CF_2)_\beta CH_2N(CH_3)_2$; $OCH_2CH_2(CF_2)_\beta CF_3$; —$(CH_2)_\beta$—$(OCH_2CH_2)_\alpha$Phenyl; and —$(CF_2)_\beta$—$(OCH_2CH_2)_\alpha$Phenyl.

The subscript $\gamma$ is an integer number from 0 to 25 (e.g., 0, 1, 2, 3, 4, 5, 6, 7, 8, 9, 10, 11, 12, 13, 14, 15, 16, 17, 18, 19, 20, 21, 22, 23, 24, and 25). The subscript $\delta$ is an integer number from 0 to 25 (e.g., 0, 1, 2, 3, 4, 5, 6, 7, 8, 9, 10, 11, 12, 13, 14, 15, 16, 17, 18, 19, 20, 21, 22, 23, 24, and 25). The subscript r is an integer number from 0 to 6 (e.g., 0, 1, 2, 3, 4, 5, and 6). The subscript s is an integer number from 0 to 3 (e.g., 0, 1, 2, and 3).

In addition, X in each instance can be independently selected from: hydrogen; halogens; $C_1$-$C_{18}$-alkyl; aryloxy, arylthio, heteroaryloxy or heteroarylthio, which may each be substituted by $C_1$-$C_{10}$-alkyl, $C_1$-$C_6$-alkoxy, cyano or carboxyl.

In addition, X in each instance can be independently selected from: methyl, ethyl, propyl, isopropyl, butyl, isobutyl, sec-butyl, tert-butyl, pentyl, isopentyl, neopentyl, tert-pentyl, hexyl, 2-methylpentyl, heptyl, 1-ethylpentyl, octyl, 2-ethylhexyl, isooctyl, nonyl, isononyl, decyl, isodecyl, undecyl, dodecyl, tridecyl, isotridecyl, tetradecyl, pentadecyl, hexadecyl, heptadecyl, octadecyl, nonadecyl and eicosyl (the above designations isooctyl, isononyl, isodecyl and isotridecyl are trivial names derived from the oxo process alcohols—cf. Ullmann's Encyklopadie der technischen Chemie, 4th edition, volume 7, pages 215 to 217, and volume 11, pages 435 and 436); 2-methoxyethyl, 2-ethoxyethyl, 2-propoxyethyl, 2-isopropoxyethyl, 2-butoxyethyl, 2- and 3-methoxypropyl, 2- and 3-ethoxypropyl, 2- and 3-propoxypropyl, 2- and 3-butoxypropyl, 2- and 4-methoxybutyl, 2- and 4-ethoxybutyl, 2- and 4-propoxybutyl, 3,6-dioxaheptyl, 3,6-dioxaoctyl, 4,8-dioxanonyl, 3,7-dioxaoctyl, 3,7-dioxanonyl, 4,7-dioxaoctyl, 4,7-dioxanonyl, 2- and 4-butoxybutyl, 4,8-dioxadecyl, 3,6,9-trioxadecyl, 3,6,9-trioxaundecyl, 3,6,9-trioxadodecyl, 3,6,9,12-tetraoxamidecyl and 3,6,9,12-tetraoxatetradecyl; 2-methylthioethyl, 2-ethylthioethyl, 2-propylthioethyl, 2-isopropylthioethyl, 2-butylthioethyl, 2- and 3-methylthiopropyl, 2- and 3-ethylthiopropyl, 2- and 3-propylthiopropyl, 2- and 3-butylthiopropyl, 2- and 4-methylthiobutyl, 2- and 4-ethylthiobutyl, 2- and 4-propylthiobutyl, 3,6-dithiaheptyl, 3,6-dithiaoctyl, 4,8-dithianonyl, 3,7-dithiaoctyl, 3,7-dithianonyl, 4,7-dithiaoctyl, 4,7-dithianonyl, 2- and 4-butylthiobutyl, 4,8-dithiadecyl, 3,6,9-trithiadecyl, 3,6,9-trithiaundecyl, 3,6,9-trithiadodecyl, 3,6,9,12-tetrathiamidecyl and 3,6,9,12-tetrathiatetradecyl; 2-monomethyl- and 2-monoethylaminoethyl, 2-dimethylaminoethyl, 2- and 3-dimethylaminopropyl, 3-monoisopropylaminopropyl, 2- and 4-monopropylaminobutyl, 2- and 4-dimethylaminobutyl, 6-methyl-3,6-diazaheptyl, 3,6-dimethyl-3,6-diazaheptyl, 3,6-diazaoctyl, 3,6-dimethyl-3,6-diazaoctyl, 9-methyl-3,6,9-triazadecyl, 3,6,9-trimethyl-3,6,9-triazadecyl, 3,6,9-triazaundecyl, 3,6,9-trimethyl-3,6,9-triazaundecyl, 12-methyl-3,6,9,12-tetraazatridecyl and 3,6,9,12-tetramethyl-3,6,9,12-tetraazamidecyl; propan-2-on-1-yl, butan-3-on-1-yl, butan-3-on-2-yl and 2-ethylpentan-3-on-1-yl; 2-methylsulfonylethyl, 2-ethylsulfonylethyl, 2-propylsulfonylethyl, 2-isopropylsulfonylethyl, 2-butylsulfonylethyl, 2- and 3-methylsulfonylpropyl, 2- and 3-ethylsulfonylpropyl, 1- and 3-propylsulfonylpropyl, 2- and 3-butylsulfonylpropyl, 2- and 4-methylsulfonylbutyl, 2- and 4-ethylsulfonylbutyl, 2- and 4-propylsulfonylbutyl and 4-butylsulfonylbutyl; carboxymethyl, 2-carboxyethyl, 3-carboxypropyl, 4-carboxybutyl, 5-carboxypentyl, 6-carboxyhexyl, 8-carboxyoctyl, 10-carboxydecyl, 12-carboxydodecyl and 14-carboxytetradecyl; sulfomethyl, 2-sulfoethyl, 3-sulfopropyl, 4-sulfobutyl, 5-sulfopentyl, 6-sulfohexyl, 8-sulfooctyl, 10-sulfodecyl, 12-sulfododecyl and 14-sulfotetradecyl; 2-hydroxyethyl, 2-hydroxypropyl, 1-hydroxyprop-2-yl, 2- and 4-hydroxybutyl, 1-hydroxybut-2-yl and 8-hydroxy-4-oxaoctyl, 2-cyanoethyl, 3-cyanopropyl, 2-methyl-3-ethyl-3-cyanopropyl, 7-cyano-7-ethylheptyl and 4-methyl-7-methyl-7-cyanoheptyl; methoxy, ethoxy, propoxy, isopropoxy, butoxy, isobutoxy, sec-butoxy, tert-butoxy, pentoxy, isopentoxy, neopentoxy, tert-pentoxy and hexoxy; carbamoyl, methylaminocarbonyl, ethylaminocarbonyl, ropylaminocarbonyl, butylaminocarbonyl, pentylaminocarbonyl, hexylaminocarbonyl, heptylaminocarbonyl, octylaminocarbonyl, nonylaminocarbonyl, decylaminocarbonyl and phenylaminocarbonyl; formylamino, acetylamino, propionylamino and benzoylamino; chlorine, bromine and iodine; phenylazo, 2-naphthylazo, 2-pyridylazo and 2-pyrimidylazo; cyclopentyl, cyclohexyl, cycloheptyl, cyclooctyl, 2-dioxanyl, 4-morpholinyl, 2- and 3-tetrahydrofuryl, 1-, 2- and 3-pyrrolidinyl and 1-, 2-, 3- and 4-piperidyl; phenyl, 2-naphthyl, 2- and 3-pyrryl, 2-, 3- and 4-pyridyl, 2-, 4- and 5-pyrimidyl, 3-, 4- and 5-pyrazolyl, 2-, 4- and 5-imidazolyl, 2-, 4- and 5-thiazolyl, 3-(1,2,4-triazyl), 2-(1,3,5-triazyl), 6-quinaldyl, 3-, 5-, 6- and 8-quinolinyl, 2-benzoxazolyl, 2-benzothiazolyl, 5-benzothiadiazolyl, 2- and 5-benzimidazolyl and 1- and 5-isoquinolyl; 2-, 3- and 4-methylphenyl, 2,4-, 3,5- and 2,6-dimethylphenyl, 2,4,6-trimethylphenyl, 2-, 3- and 4-ethylphenyl, 2,4-, 3,5- and 2,6-diethylphenyl, 2,4,6-triethylphenyl, 2-, 3- and 4-propylphenyl, 2,4-, 3,5- and 2,6-dipropylphenyl, 2,4,6-tripropylphenyl, 2-, 3- and 4-isopropylphenyl, 2,4-, 3,5- and 2,6-diisopropylphenyl, 2,4,6-triisopropylphenyl, 2-, 3- and 4-butylphenyl, 2,4-, 3,5- and 2,6-dibutylphenyl, 2,4,6-tributylphenyl, 2-, 3- and 4-isobutylphenyl, 2,4-, 3,5 and 2,6-diisobutylphenyl, 2,4,6-triisobutylphenyl, 2-, 3- and 4-sec-butylphenyl, 2,4-, 3,5- and 2,6-di-sec-butylphenyl and 2,4,6-tri-sec-butylphenyl; 2-, 3- and 4-methoxyphenyl, 2,4-, 3,5- and 2,6-dimethoxyphenyl, 2,4,6-trimethoxyphenyl, 2-, 3- and 4-ethoxyphenyl, 2,4-, 3,5- and 2,6-diethoxyphenyl, 2,4,6-triethoxyphenyl, 2-, 3- and 4-propoxyphenyl, 2,4-, 3,5- and 2,6-dipropoxyphenyl, 2-, 3- and 4-isopropoxyphenyl, 2,4- and 2,6-diisopropoxyphenyl and 2-, 3- and 4-butoxyphenyl; 2-, 3- and 4-chlorophenyl and 2,4-, 3,5- and 2,6-dichlorophenyl; 2-, 3- and 4-hydroxyphenyl and 2,4-, 3,5- and 2,6-dichlorophenyl; 2-, 3- and 4-hydroxyphenyl and 2,4-, 3,5- and 2,6-dihydroxyphenyl; 2-, 3- and 4-cyanophenyl; 3- and 4-carboxyphenyl; 3- and 4-carboxyamidophenyl, 3- and 4-N-methylcarboxamidophenyl and 3- and 4-N-ethylcarboxamidophenyl; 3- and 4-acetylaminophenyl, 3- and 4-propionylaminophenyl and 3- and 4-butyrylaminophenyl; 3- and 4-N-phenylaminophenyl, 3- and 4-N-(o-tolyl)aminophenyl, 3- and 4-N-(m-tolyl)aminophenyl and 3- and 4-(p-tolyl)aminophenyl; 3- and 4-(2-pyridyl)aminophenyl, 3- and 4-(3-pyridyl)aminophenyl, 3- and 4-(4-pyridyl)aminophenyl, 3- and 4-(2-pyrimidyl)aminophenyl and 4-(4-pyrimidyl)aminophenyl; 4-phenylazophenyl, 4-(1-naphthylazo)phenyl, 4-(2-naphthylazo)phenyl, 4-(4-naphthylazo)phenyl, 4-(2-pyridylazo)phenyl, 4-(3-pyridylazo)phenyl, 4-(4-pyridylazo)phenyl, 4-(2-pyrimidylazo)phenyl, 4-(4-pyrimidylazo)phenyl and 4-(5-pyrimidylazo)phenyl; and phenoxy, phenylthio, 2-naphthoxy, 2-naphthylthio, 2-, S— and 4-pyridyloxy, 2-, 3- and 4-pyridylthio, 2-, 4- and 5-pyrimidyloxy and 2-, 4- and 5-pyrimidylthio.

The perylenetetracarboxylic diimide charge-transport Materials have a room temperature, zero field electron mobility of at least about $10^{-6}$ to $10^2$ cm$^2$/Vs, $10^4$ to $10^2$ cm$^2$/Vs, and $10^{-2}$ to $10^2$ cm$^2$/Vs.

The distance between adjacent molecules in adjacent layers is about 3.6 Å and 3.1 Å.

In an embodiment, a polymer layer of the perylenetetracarboxylic diimide charge-transport material can be formed by disposing a layer of a polymerizable material including monomers, oligomers, and/or polymers of the perylenetetracarboxylic diimide charge-transport material, onto a surface. The molecules of the perylenetetracarboxylic diimide charge-transport material can be optionally aligned into a substantially uniform orientation or a patterned orientation such that in each pattern the orientation is substantially uniform. Then, a polymerization reaction is initiated and the monomers, oligomers and/or polymers of the perylenetetracarboxylic diimide charge-transport material form a layer of polymerized charge-transport material. The polymerization process can be repeated to produce a plurality of layers. In addition, cross-linking processes can also be performed to cross-link molecules in adjacent layers. One skilled in the art could perform a polymerization process in a manner different than described here and obtain the polymer layer of the perylenetetracarboxylic diimide charge-transport material, and such processes are intended to be included herein.

A plurality of layers of perylenetetracarboxylic diimide charge-transport material can be produced to form a charge-transport layer that each can have a thickness of about 0.01 to 1000 μM, 0.05 to 100 μm, 0.05 to 10 μm. The length and width of the charge-transport layer can vary depending on the application, but in general, the length can be about 0.01 μm to 1000 cm, and the width can be about 0.01 μm to 1000 cm.

It should be noted that in some embodiments is it advantageous to have the aromatic core aligned parallel to the substrate materials (e.g., in photovoltaic cells and other devices where a perpendicular alignment may be more preferable (e.g., transistor configurations)).

It should also be noted that the perylenetetracarboxylic diimide charge-transport material could be used as mixtures with other electron transport materials including those described herein, as well as others. Likewise, the disclosed perylenetetracarboxylic diimide charge-transport material could be used in combination with other hole transport materials, sensitizers, emitters, chromophores, and the like, to add other functionality to devices.

In addition, the perylenetetracarboxylic diimides could be useful as sensitizers. Since the perylenetetracarboxylic diimide core is electron deficient, it is possible to have either/both X or Y groups be electron donors that donate electron density (e.g., —C≡C-aryl; —(C≡C)-$_2$aryl; —(C≡C)-$_3$aryl; —HC═CH-aryl; —(HC═CH)-$_2$-aryl; and —(HC═CH)$_3$-aryl, where the aryl is described herein) to the perylenetetracarboxylic diimide core either in the ground-state or upon one or multiphoton excitation. Therefore, such molecules can be particularly useful in sensitizer applications, where creation of charge separation upon excitation is beneficial. Such applications include, but are not limited to, photovoltaic devices, photodetectors, photorefractive polymers, multi-photon absorbing materials.

Furthermore, when Y is a conjugated group including those that are substituted with donors, or themselves are electron rich, the molecules can have absorption bands that extend into the near-infrared absorbing region (e.g., 700-1500 nm) of the electromagnetic spectrum. Such materials can be useful for eye protection, as sensors, can be useful in optical data storage applications, as photovoltaic, as materials in photodetectors, as materials to convert near-infrared energy to heat, and other applications that beriefit from near-infrared absorption as would be known to those skilled in the art of the application of near-infrared absorbing materials.

The polymerization and cross-linking of the perylenetetracarboxylic diimide charge-transport material molecules can be performed using methods understood by those skilled in the art. In general, polymerization can take place by exposure to heat or actinic radiation in the presence of an initiator. In general, cross-linking can occur due to internal reactions and/or by the addition of a cross-linking additive. Additional details regarding preparation of the perylenetetracarboxylic diimide charge-transport materials are described in Examples 1-2.

Actinic radiation means irradiation with radiation (e.g., UV light, IR light or visible light, irradiation with X-rays or gamma rays or irradiation with high-energy particles, such as ions or electrons). In an embodiment, a polymerization initiator can be used that decomposes when heated to produce free radicals or ions that start the polymerization. In another embodiment, the polymerization can be carried out in the presence of an initiator absorbing at the wavelength of the actinic radiation. For example, when polymerizing using. UV light, an UV initiator can be used that decomposes under UV irradiation to produce free radicals or ions that start the polymerization reaction.

The UV initiator can include chemicals such as, but not limited to, a free radical initiator, a cationic initiator, or combinations thereof. The free-radical initiator includes compounds that produce a free radical on exposure to UV radiation. The free-radical is capable of initiating a polymerization reaction among the monomers and/or oligomers present.

Examples of free-radical initiators include, but are not limited to, benzophenones (e.g., benzophenone, methyl benzophenone, Michler's ketone, and xanthones), acylphosphine oxide type free radical initiators (e.g., 2,4,6-trimethylbenzoyldiphenyl phosphine oxide (TMPO), 2,4,6-trimethylbenzoylethoxyphenyl phosphine oxide (TEPO), and bisacylphosphine oxides (BAPO's)), azo compounds (e.g., AIBN), benzoins, and benzoin alkyl ethers (e.g., benzoin, benzoin methyl ether and benzoin isopropyl ether).

In addition, the free radical photoinitiator can include, but is not limited to: acyloin; a derivative of acyloin, such as benzoin ethyl ether, benzoin isobutyl ether, desyl bromide, and a-methylbenzoin; a diketone, such as benzil and diacetyl; an organic sulfide, such as diphenyl monosulfide, diphenyl disulfide, desyl phenyl sulfide, and tetramethylthiuram monosulfide; a thioxanthone; an S-acyl dithiocarbamate, such as S-benzoyl-N,N-dimethyldithiocarbamate and S-(p-chlorobenzoyl)-N,N-dimethyldithiocarbamate; a phenone, such as acetophenone, α-α-a-tribromoacetophenone, o-nitro-α-α-α-tribromoacetophenone, benzophenone, and p,p'-tetramethyldiaminobenzophenone; a quinone; a triazole; a sulfonyl halide, such as p-toluenesulfonyl chloride; a phosphorus-containing photoinitiator, such as an acylphosphine oxide; an acrylated amine; or mixtures thereof.

The free-radical initiator can be used alone or in combination with a co-initiator. Co-initiators are used with initiators that need a second molecule to produce a radical that is active in UV-systems. For example, benzophenone uses a second molecule, such as an amine, to produce a reactive radical. A preferred class of co-initiators are alkanolamines such as, but not limited to, triethylamine, methyldiethanolamine, and triethanolamine Suitable cationic initiators include, but are not limited to, compounds that form aprotic acids or Brønsted acids upon exposure to UV light sufficient to initiate polymerization. The cationic initiator used can be a single compound, a mixture of two or more active compounds, or a combination of two or more different compounds (e.g., co-initiators).

The cationic photoinitiator can include, but is not limited to, onium salt, such as a sulfonium salt, an iodonium salt, or mixtures thereof. In addition, the cationic photoinitiatior can include, but is not limited to, an aryldiazonium salt, a bis-diaryliodonium salt, a diaryliodonium salt of sulfonic acid, a triarylsulfonium salt of sulfonic acid, a diaryliodonium salt of boric acid, a diaryliodonium salt of boronic acid, a triarylsulfonium salt of boric acid, a triarylsulfonium salt of boronic acid, or mixtures thereof. Examples of cationic photoinitiatiors include, but are not limited to, diaryliodonium hexafluoroantimonate, aryl sulfonium hexafluorophosphate, aryl sulfonium hexafluoroantimonate, bis(dodecyl phenyl) iodonium hexafluoroarsenate, tolyl-cumyliodonium tetrakis(pentafluorophenyl) borate, bis(dodecylphenyl) iodonium hexafluoroantimonate, dialkylphenyl iodonium hexafluoroantimonate, diaryliodonium salts of perfluoroalkylsulfonic acids (such as diaryliodonium salts of perfluorobutanesulfonic acid, perfluoroethanesulfonic acid, perfluorooctanesulfonic acid, and trifluoromethane sulfonic acid), diaryliodonium salts of aryl sulfonic acids (such as diaryliodonium salts of para-toluene sulfonic acid, dodecylbenzene sulfonic acid, benzene sulfonic acid, and 3-nitrobenzene sulfonic acid), triarylsulfonium salts of perfluoroalkylsulfonic acids (such as triarylsulfonium salts of perfluorobutanesulfonic acid, perfluoroethanesulfonic acid, perfluorooctanesulfonic acid, and trifluoromethane sulfonic acid), triarylsulfonium salts of aryl sulfonic acids (such as triarylsulfonium salts of para-toluene sulfonic acid, dodecylbenzene sulfonic acid, benzene sulfonic acid, and 3-nitrobenzene sulfonic acid), diaryliodonium salts of perhaloarylboronic acids, triarylsulfonium salts of perhaloarylboronic acid, or mixtures thereof.

The visible radiation initiator can include, but is not limited to, diketones (e.g., camphorquinone, 1,2-acenaphthylenedione, 1H-indole-2,3-dione, 5H-dibenzo[a,d]cycloheptene-10, and 11-dione), phenoxazine dyes (e.g., Resazurin, Resorufin), acylphosphine oxides, (e.g., diphenyl (2,4,6-trimethylbenzoyl) phosphine oxide), and the like.

In an embodiment, the polymerization of the perylenetetracarboxylic diimide charge-transport materials can be carried out as in-situ polymerization of a coated layer of the material, possibly during fabrication of the device of interest that includes the perylenetetracarboxylic diimide charge-transport material. In case of liquid crystal materials, these are preferably aligned in their liquid crystal state into homeotropic orientation prior to polymerization, where the conjugated pi-electron systems are orthogonal to the direction of charge transport. This ensures that the intermolecular distances are minimized and hence the energy required to transport charge between molecules is minimized. The molecules are then polymerized and/or cross-linked to fix the uniform orientation of the liquid crystal state. Alignment and curing are carried out in the liquid crystal phase or mesophase of the material. This technique is known in the art and is generally described for example in D. J. Broer, et al., Angew. Makromol. Chem. 183, (1990), 45-66.

Polymers including the perylenetetracarboxylic diimide charge-transport material can have a molecular weight from about 3000 to 300,000 daltons, and about 2000 to 200,0000 daltons.

It should be emphasized that the embodiments of the present disclosure and Examples 1 and 2 below are merely possible examples of implementations, and are merely set forth for a clear understanding of the principles of this disclosure. Many variations and modifications may be made to the embodiment(s) of the disclosure and Examples 1 and 2 without departing substantially from the spirit and principles of the disclosure. All such modifications and variations are intended to be included herein within the scope of this disclosure and protected by the claims.

EXAMPLE 1

The following is a general synthesis of embodiments of perylenediimides compounds:

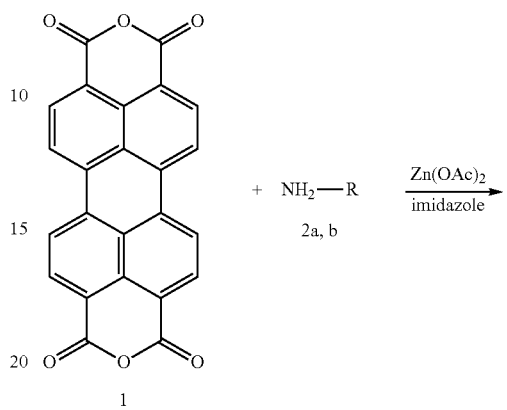

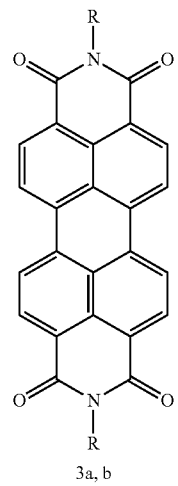

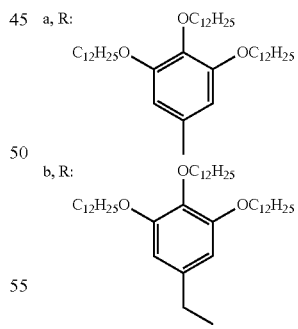

According to the general synthesis scheme above, perylenetetracarboxylic diimides are synthesized by two-fold condensation between perylenetetracarboxylic dianhydride and the corresponding amine with zinc acetate as a catalyst. Compounds 2a and 3a were synthesized according to F. Würthner, C. Thalacker, S. Diele, C. Tschierske, Chem. Eur. J. 2001, 7, 2245, which is incorporated herein by reference. Compound 2b (trialkoxybenzyl amine) was synthesized according to the following scheme:

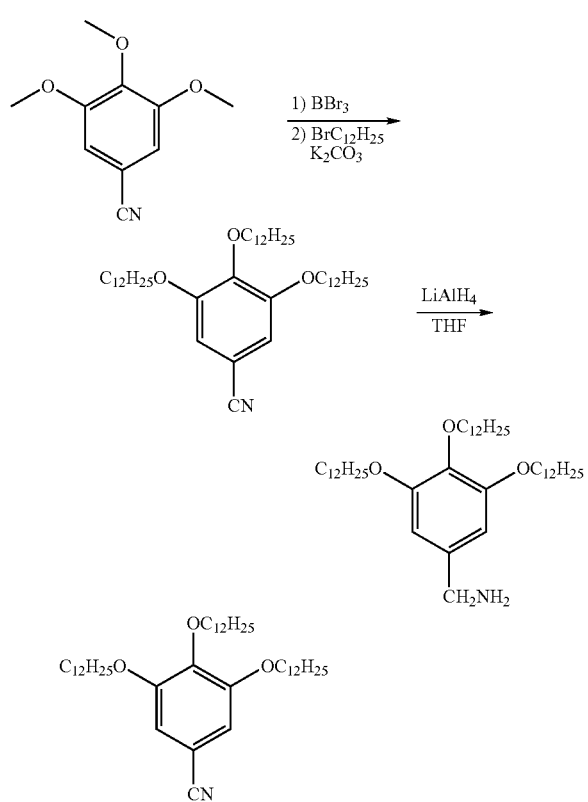

To a solution of 3,4,5-trimethoxybenzonitrile (4.88 g, 25.25 mmol) in 30 ml dry dichloromethane cooled at −78° C. under nitrogen, was added boron tribromide (9.3 ml, 98.34 mmol) in 10 ml dichloromethane dropwise. The reaction was slowly warmed to room temperature and stirred overnight. Then the reaction was cooled to −78° C. again, ice water was added dropwise carefully. The mixture was stirred at room temperature for 2 h, extracted with ethyl acetate and the organic solution was dried over anhydrous magnesium sulfate, filtered. The solvent was removed and slightly yellow solid was obtained.

The solid was dissolved in 100 ml DMF, to which potassium carbonate (13.2 g, 95.51 mmol) and bromododecane (22.15 g, 88.89 mmol) were added. The reaction was heated at 100° C. for 42 h. After cooling to room temperature, water was added and the mixture was extracted with dichloromethane. The organic solution was dried over anhydrous magnesium sulfate and filtered. The solvent was removed and the residue was recrystallized from acetone. 13.84 g (84%) white solid was obtained. $^1$H NMR (500 MHz, CDCl$_3$): δ(ppm): 6.79 (s, 2H), 3.98 (t, J=6.5 Hz, 2H), 3.94 (t, J=6.5 Hz, 4H), 1.78 (m, 4H), 1.71 (m, 2H), 1.44 (m, 6H), 1.27 (m, 48H), 0.86 (t, J=7.0 Hz, 9H). $^{13}$C NMR (125 MHz, CDCl$_3$): δ(ppm): 153.4, 142.5, 119.3, 110.4, 106.1, 73.7, 69.4, 31.9, 30.3, 29.73, 29.70, 29.68, 29.65, 29.60, 29.52, 29.38, 29.35, 29.33, 29.2, 26.0, 22.7, 14.1. MS (EI): calcd. for C$_{43}$H$_{77}$NO$_3$ m/z: 655.5904. found 655.5925. Elemental analysis: calcd. for C$_{43}$H$_{77}$NO$_3$, C, 78.72; H, 11.83; N, 2.13. found C, 78.90; H, 11.96; N, 2.18.

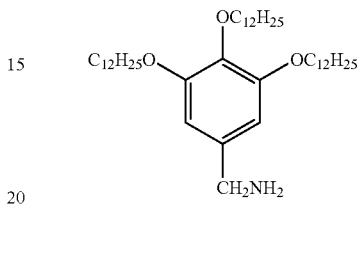

To a suspension of LiAlH$_4$ (1.57 g, 42.37 mmol) in 100 ml dry THF, was added 3,4,5-trisdodecyloxybenzonitrile (12.43 g, 18.95 mmol) solution in 200 ml dry THF at 0° C. The reaction mixture was warmed to room temperature and then heated to reflux for 2 hours. After cooling to room temperature, the reaction mixture was cooled again at 0° C., 40 ml ice water was added dropwise and then 40 ml 20% NaOH solution. The mixture was extracted with ethyl acetate. The organic solution was washed with brine, dried over anhydrous magnesium sulfate and the solvent removed. The residue was recrystallized from acetone and 11.23 g (90%) white solid was obtained. $^1$H NMR (500 MHz, C$_6$D$_6$): δ(ppm): 7.08 (s, 2H), 4.21 (t, 2H), 3.67 (t, 4H), 1.87 (m, 2H), 1.63 (m, 6H), 1.37 (m, 56H), 0.92 (t, 9H). $^{13}$C NMR (125 MHz, C$_6$D$_6$): δ (ppm): 190.4, 154.1, 144.4, 132.3, 108.1, 73.6, 69.1, 32.33, 32.32, 30.96, 30.22, 30.20, 30.19, 30.15, 30.12, 30.08, 30.02, 29.83, 29.82, 29.79, 29.66, 26.6, 26.5, 23.1, 14.3. MS (EI): calcd. for C$_{43}$H$_{81}$NO$_3$ m/z: 659.6216. found 659.6209.

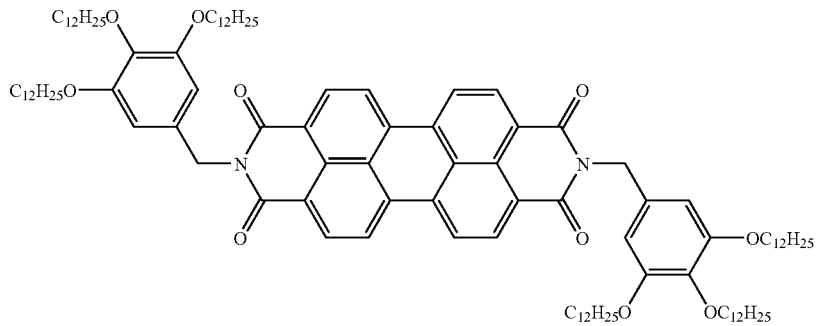

A mixture of 3,4,5-trisdodecyloxy-benzylamine (11.12 g, 16.85 mmol), perylene tetracarboxylic dianhydride (3.0 g, 7.49 mmol), zinc acetate (0.81 g, 4.40 mmol) and imidazole (50 g) was heated at 150° C. under argon for 12 h. After cooling to room temperature, ethanol was added and the precipitate was filtered, washed with ethanol. The solid was collected, dissolved in dichloromethane, washed with 2 N HCl solution twice and dried over anhydrous magnesium sulfate. The solvent was removed and the residue was purified by chromatography eluting with chloroform. 11.6 g (92%) of the title compound was obtained as red solid. $^1$H NMR (500 MHz, CDCl$_3$): δ (ppm): 8.58 (d, J=8.0 Hz, 4H), 8.44 (d, J=8.0 Hz, 4H), 6.83 (s, 4H), 5.27 (s, 4H), 3.98 (t, J=6.2 Hz, 8H), 3.88 (t, J=6.2 Hz, 8H), 1.76 (m, 8H), 1.67 (m, 4H), 1.42 (m, 121-1), 1.22 (m, 96H), 0.85 (m, 18H). $^{13}$C NMR (125 MHz, CDCl$_3$): δ (ppm): 163.3, 153.0, 137.9, 134.6, 132.0, 131.5, 129.2, 126.3, 123.3, 123.0, 108.2, 73.4, 69.2, 43.9, 31.9, 30.3, 29.72, 29.71, 29.67, 29.61, 29.47, 29.45, 29.37, 26.1, 22.7, 14.1. (ten carbon esonances were not observed presumably due to near equivalencies leading to overlap of resonances). MS (MALDI): calcd. for $C_{110}H_{166}N_2O_{10}$, m/z: 1675.2537; found: 1675.2556. Elemental Analysis: calcd. for $C_{110}H_{166}N_2O_{10}$, C, 78.81; H, 9.98; N, 1.67. found C, 78.66; H, 10.06; N, 1.70.

Here is a general synthesis of donor/acceptor substituted compounds.

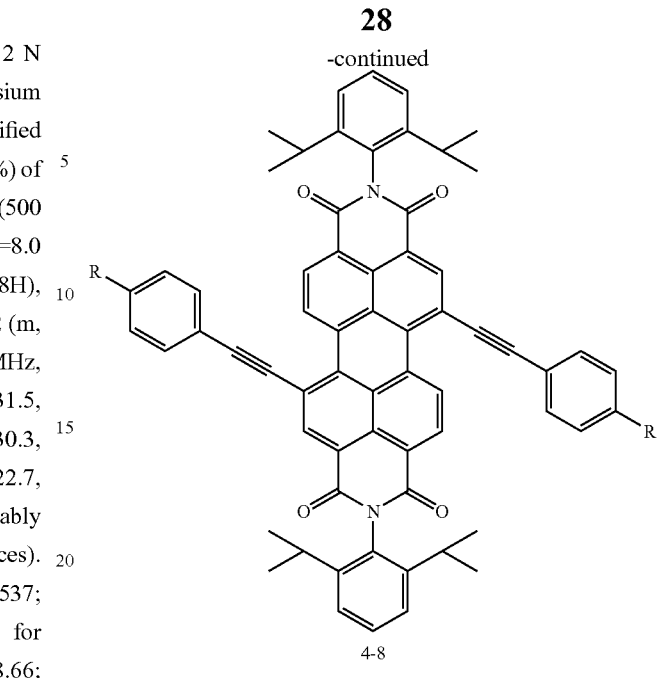

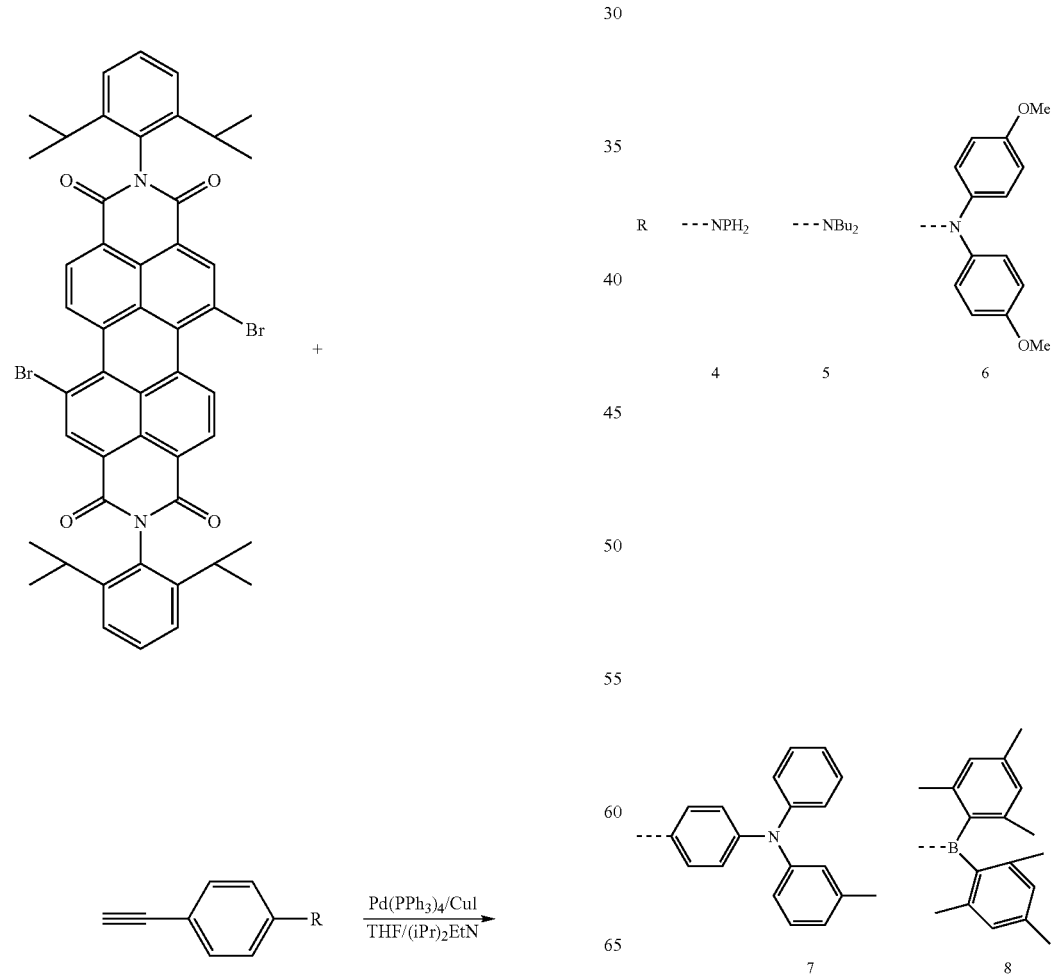

Example a

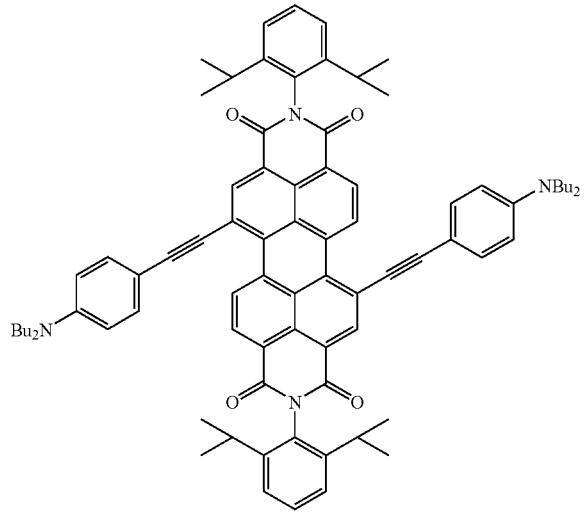

To a solution of N,N'-Bis(2,6-diisopropylphenyl)-1,7-dibromoperylene-3, 4:9, 10-tetracarboxydiimide (0.5 g, 0.57 mmol) in 40 ml of 1:1 (v:v) solution of THF and ethyldiisopropylamine degassed with argon, were added copper(I) iodide (54 mg, 280 µmol) and tetrakis(triphenylphosphino)palladium(0) (74 mg, 63 µmol). The mixture was further degassed for 10 minutes, to which was added (4-ethynyl-phenyl)-dibutyl-amine (0.34 g, 1.48 mmol). The reaction was heated at 80° C. under argon for 15 hours. After cooling to room temperature, the reaction was poured into 150 ml 2 N HCl solution and extracted with dichloromethane. The organic phase was dried over anhydrous magnesium sulfate, the solvent removed and the residue purified by flash chromatography eluting with 1:1 dichloromethane/hexane. After removal of solvent, 0.6 g (89%) of a dark green solid was obtained. $^1$H NMR (300 MHz, CDCl$_3$), δ (ppm): 10.28 (d, J=8.1 Hz, 2H), 8.96 (s, 2H), 8.79 (d, J=8.4 Hz, 2H), 7.51 (triplet, J=8.4 Hz, 6H), 7.36 (d, J=7.8 Hz, 4H), 6.68 (d, J=8.7 Hz, 4H), 3.33 (t, J=7.2 Hz, 8H), 2.79 (m, J=6.9 Hz, 4H), 1.60 (m, J=6.3 Hz, 8H), 1.35 (m, J=7.2 Hz, 8H), 1.19 (dd, J$_1$=6.75 Hz, J$_2$=1.65 Hz, 24H), 0.97 (t, J=7.2 Hz, 12H). MS (FAB): m/z calcd. for C$_{80}$H$_{84}$N$_4$O$_4$ 1164.6493. found 1164.6481. Elemental Analysis: calc. for C$_{80}$H$_{84}$N$_4$O$_4$ C, 82.44; H, 7.26; N, 4.81. found C, 82.25; H, 7.16; N, 4.75.

Example b

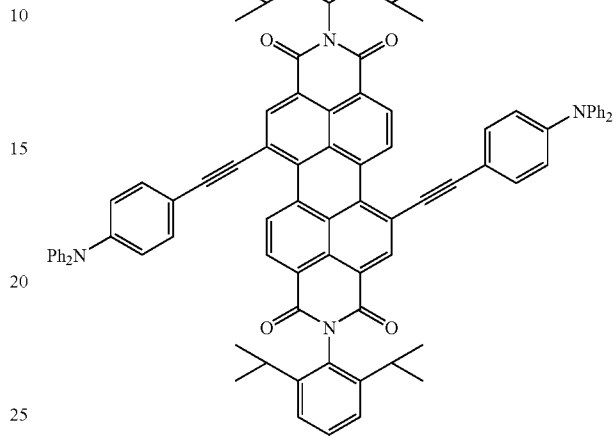

To a solution of 1,7-dibromo-N,N'-di((2,5-diisopropyl)phenyl)-3,4:9,10-perylenebis(dicarboximide) (0.61 g, 0.70 mmol) in 50 ml 1:1 mixture of THF and ethyldiisopropylamine degassed with nitrogen, were added tetrakis(triphenylphosphino)palladium(0) (73 mg, 63 µmol), copper(I) iodide (0.182 g, 0.96 mmol) and (4-diphenylaminophenyl)acetylene (0.45 g, 1.67 mmol). The reaction mixture was heated at 80° C. under nitrogen for 24 hours. After cooling to room temperature, the mixture was extracted with dichloromethane over 100 ml 2 M HCl solution. The organic solution was dried over anhydrous magnesium sulfate, filtered and concentrated. The residue was taken up with silica gel and purified by flash chromatography eluting with 1:1 dichloromethane/hexane. 0.78 g (89%) of a dark solid was obtained. $^1$H NMR (300 MHz, CDCl$_3$), δ (ppm): 10.21 (d, J=8.4 Hz, 2H), 8.97 (s, 2H), 8.77 (d, J=8.4 Hz, 2H), 7.49 (d, J=9.0 Hz, 6H), 7.32 (m, 12H), 7.11 (m, 14H), 2.76 (m, J=6.7 Hz, 4H), 1.18 (d, J=6.6 Hz, 24H). MS (FAB): m/z calc. for C$_{89}$H$_{68}$N$_4$O$_4$ 1244.5241. found 1244.5276. Elemental analysis: calcd. for C$_{89}$H$_{68}$N$_4$O$_4$, C, 84.86; H, 5.50; N, 4.50. found C, 85.21; H, 5.52; N, 4.46.

Example c

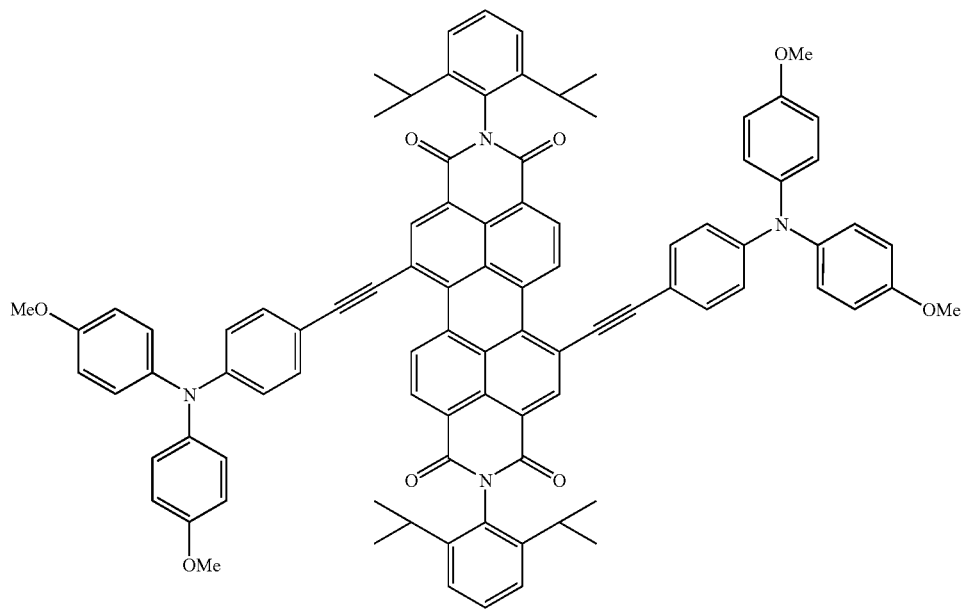 [SMILES: COc1ccc(N(c2ccc(C#Cc3cc4c5c(ccc6c7c(C#Cc8ccc(N(c9ccc(OC)cc9)c9ccc(OC)cc9)cc8)cc8c9c(ccc(c3c56)c97)C(=O)N(c3c(C(C)C)cccc3C(C)C)C8=O)C(=O)N(c3c(C(C)C)cccc3C(C)C)C4=O)cc2)c2ccc(OC)cc2)cc1]

To a mixture of 1,7-dibromo-N,N'-di((2,5-diisopropyl)phenyl)-3, 4:9, 10-perylenebis(dicarboximide) (0.256 g, 29 mmol), 4-(di(4-methoxyphenyl)amino)-phenyl-acetylene (0.34 g, 1.0 mmol) in 40 ml 1:1(v/v) mixture of THF and diethyl-isopropylamine degassed with argon, were added tetrakis(triphenylphosphino)palladium(0) (34 mg, 29 mop, copper (I) iodide (81 mg, 43 μmol). The reaction mixture was heated at 80° C. under argon for 18 hours. After cooling to room temperature, the reaction mixture was poured into 50 ml 2N HCl solution, extracted with dichloromethane. The organic solution was dried over anhydrous magnesium sulfate, filtered. The solvent was removed and the residue was taken up with silica gel, purified by flash chromatography eluting with 1:1 dichloromethane/hexane. After removal of solvent, 0:25 g (62%) of a dark blue solid was obtained. $^1$H NMR (300 MHz, CDCl$_3$): δ (ppm), 10.23 (d, J=8.1 Hz, 2H), 8.97 (s, 2H), 8.77 (d, J=8.1 Hz, 2H), 7.45 (m, 12H), 7.13 (bs, 8H), 6.89 (d, 10H), 3.82 (s, 12H), 2.78 (m, J=6.6 Hz, 4H), 2.19 (d, 24H). MS (FAB): m/z calcd. for C$_{92}$H$_{76}$N$_4$O$_8$ 1364.5663. found 1364.5690. Elemental analysis: calcd. for C$_{92}$H$_{76}$N$_4$O$_8$, C, 80.92; H, 5.61; N, 4.10. found C, 80.84; H, 5.64; N, 4.13.

Example d

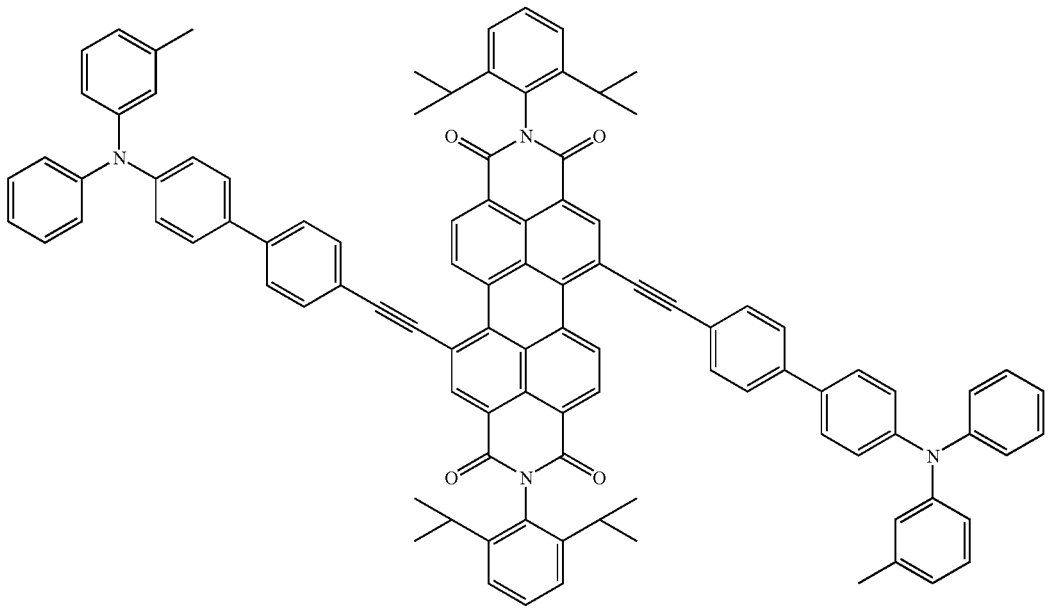 [SMILES: Cc1cccc(N(c2ccccc2)c2ccc(-c3ccc(C#Cc4cc5c6c(ccc7c8c(C#Cc9ccc(-c%10ccc(N(c%11ccccc%11)c%11cccc(C)c%11)cc%10)cc9)cc9c%10c(ccc(c4c67)c%108)C(=O)N(c4c(C(C)C)cccc4C(C)C)C9=O)C(=O)N(c4c(C(C)C)cccc4C(C)C)C5=O)cc3)cc2)c1]

1,7-dibromo-bis(2,6-diisopropylphenyl)-3,4,9,19-tetra-carboxy perylene diimide (0.22 g, 0.25 mmol) and (4'-Ethynyl-biphenyl-4-yl)-phenyl-m-tolyl-amine (0.22 g, 0.61 mmol) were dissolved in a mixture of 10 ml toluene, 5 ml dioxane and 10 ml diisopropyl-ethyl amine. The solution was purged with nitrogen and dichlorobis(cyanophenyl) palladium(II) (0.02 g, 0.05 mmol) and copper(I) iodide (0.01 g, 0.05 mmol) were added and the resulting mixture further purged with nitrogen for 10 min. 10% (wt) tri(tertbuyl)phosphine hexane solution (0.21 g, 0.1 mmol) was added. The reaction mixture was heated at 80° C. for 20 hours. After cooling down to room temperature, the reaction was diluted with chlororform, washed over 2 N HCl solution. The organic layer was separated, dried over anhydrous magnesium sulfate and filtered. The solvent was removed and the residue purified by flash chromatography eluting with chloroform. After removal of solvent, 0.27 g (76%) of a dark purple solid was obtained. $^1$H NMR (500 MHz, CDCl$_3$): δ(ppm): 10.25 (d, J=8.0 Hz, 2H), 9.03 (s, 2H), 8.85 (d, J=8.5 Hz), 7.73 (d, J=8.5 Hz, 4H), 7.68 (d, J=8.5 Hz, 4H), 7.52 (m, 6H), 7.37 (d, J=8.0 Hz, 4H), 7.27 (m, 4H), 7.15 (m, 10H), 7.04 (t, J=8.0 Hz, 2H), 6.96 (s, 2H), 6.93 (d, J=8.5 Hz, 2H), 6.87 (d, J=7.5 Hz, 2H), 2.79 (m, 4H), 2.27 (s, 6H), 1.20 (d, 24H). MS (MALDI): m/z calcd. for $C_{102}H_{80}N_4O_4$: 1424.6180; found: 1424.6104. Elemental Analysis: calcd. for $C_{102}H_{80}N_4O_4$, C, 85.93; H, 5.66; N, 3.93. found C, 85.88; H, 5.66; N, 3.91.

Absorption: Compounds 3a and 3b have almost the same absorption properties in terms of both band shape and band position, which is consistent with literature[1], since the imide-substitution is electronically decoupled from the core[2]. FIG. 1 illustrates the absorption spectra of compounds 3a and 3b in chloroform.

Figure 2:
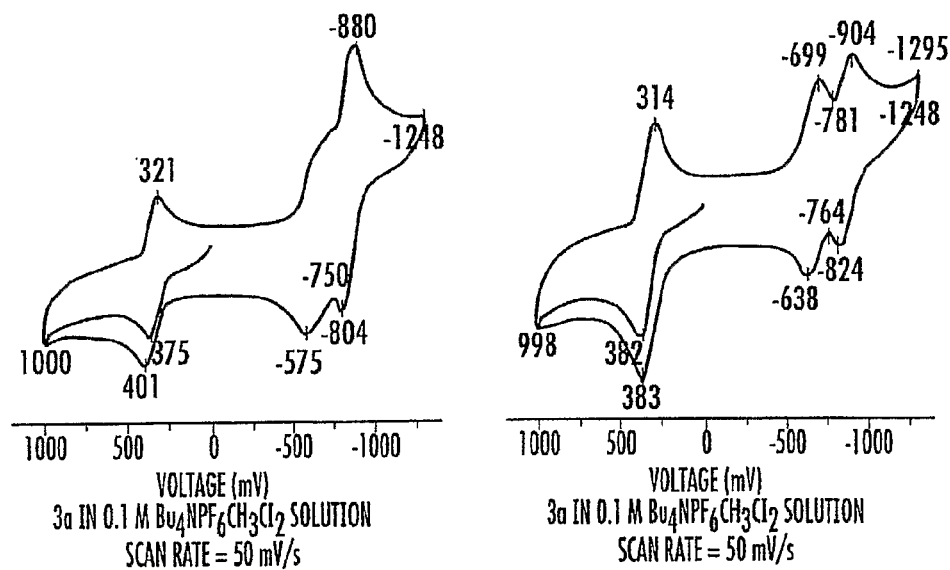
FIG. 2 illustrates cyclic voltammograms for compounds 3a and 3b.

Electrochemistry: Compound 3b gives two successive reversible one-electron reduction waves. The first one-electron reduction of compound 3a does not show itself as a nice wave, however, the half-wave reduction potential was calculated by multi-peak fitting and it was consistent with the literature value. FIG. 2 illustrates cyclic voltammograms for compounds 3a and 3b.

TABLE 1

Half-wave potentials of perylenediimide LCs vs ferrocenium/ferrocene couple.

| | X$^-$/X (V) | | X$^{2-}$/X$^-$ (V) | |
|---|---|---|---|---|
| | Experimental data | Literature data | Experimental data | Literature data |
| PDI1 | −0.97 | −0.98 | −1.19 | −1.19 |
| PDI2 | −1.02 | N/A | −1.21 | N/A |

Figure 3:
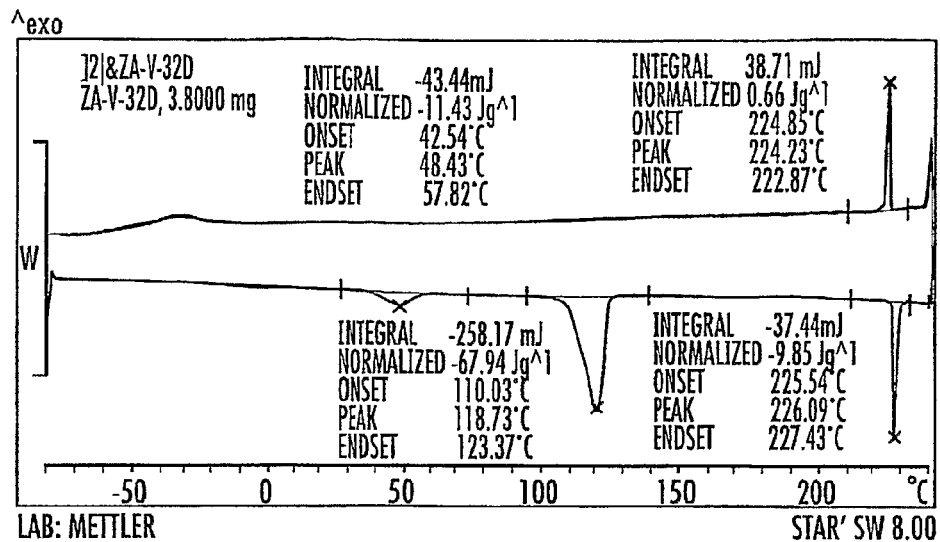
FIG. 3 illustrates the first DSC cycle for compound 3b.
Figure 4:
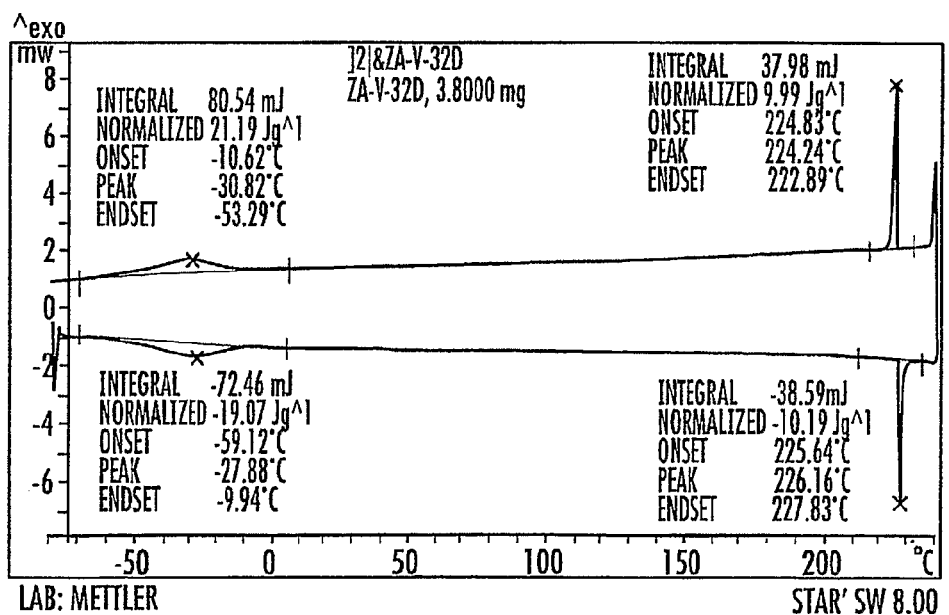
FIG. 4 illustrates the second DSC cycle for compound 3b.

Differential Scanning calorimetry (DSC): DSC was taken for compound 3b in the temperature range of −80° C. to 240° C. The first heating-cooling cycle reveals several transitions. The second cycle represents two reversible transitions: one around −30° C. and the other around 225° C. The nature of the broad low temperature transition is unknown and the high temperature transition most likely is from liquid crystalline phase to isotropic liquid, as the material melts at this temperature, which was visually observed on a hot plate. Upon cooling from the isotropic liquid to room temperature, fan-like texture was observed with optical polarized microscope (OPM) between crossed polarizers, indicative of columnar discotic liquid crystal. FIG. 3 illustrates the first DSC cycle for compound 3b. FIG. 4 illustrates the second DSC cycle for compound 3b.

Figure 5:
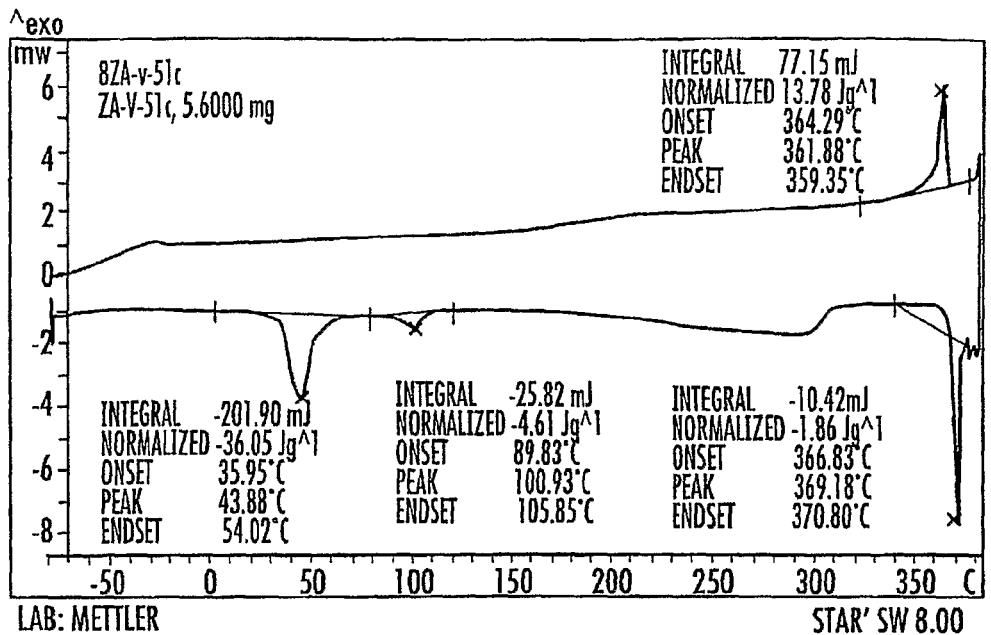
Figure 6:
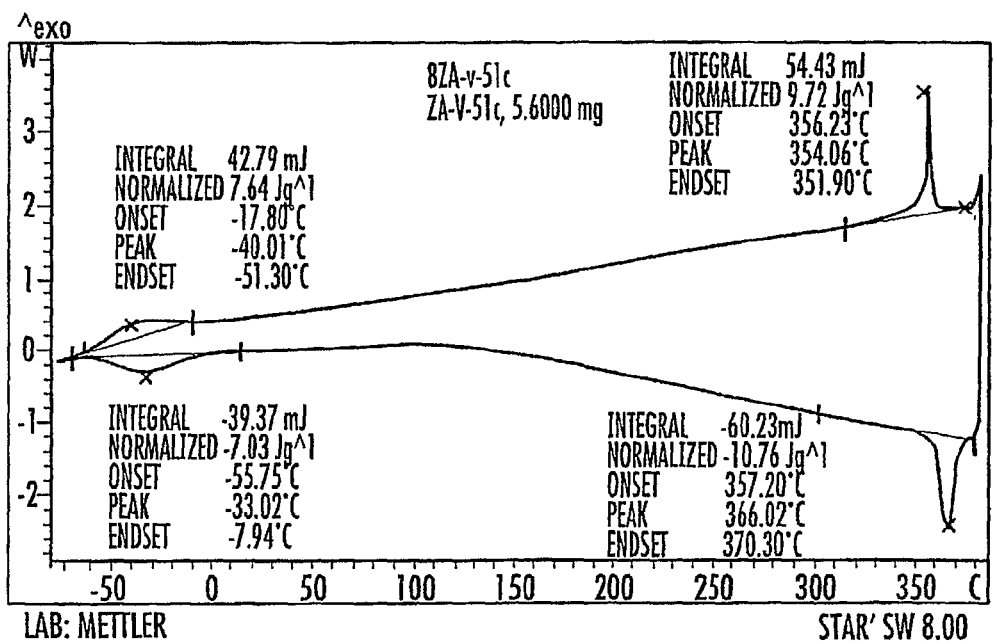

Compound 3a was studied by DSC in the temperature range of −80° C. to 380° C. Compound 3a has been demonstrated as a liquid crystal in the temperature range of −30° C. to 300° C.[1a]. Since compound 3a melts above 365° C. as observed on a hot plate, the transition around 360° C. should be liquid crystal to isotropic liquid transition, though the transition temperature is slightly different from the literature. FIG. 5 illustrates the first DSC cycle of 3a. FIG. 6 illustrates the second DSC cycle of 3a.

TABLE 2

Transition temperatures and transition enthalpies

| | T (° C.) (ΔH (kJ/mol)) | |
|---|---|---|
| | Second heating | Second cooling |
| 3a | −33.0 (−11.6); 365.0 (−17.7) | 354.1 (16.0); −40.0 (12.6) |
| 3b | −27.9 (−32.0); 226.2 (−17.0) | 224.2 (16.7); −30.8 (35.5) |

Figure 7:
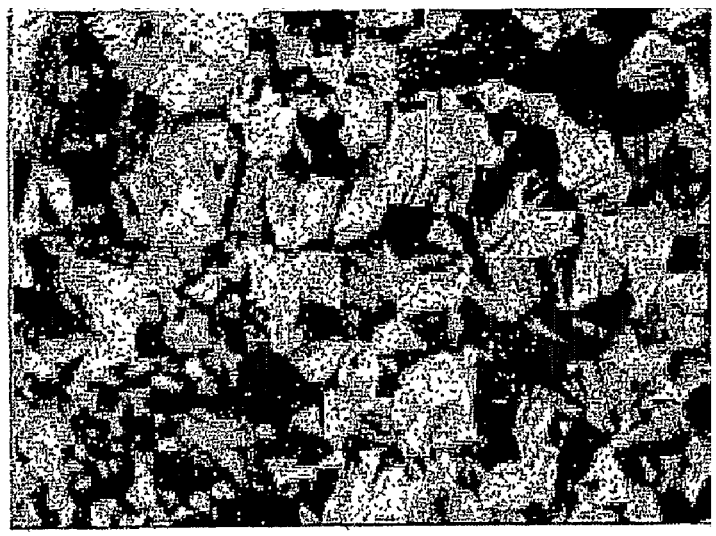
FIG. 7 illustrates the texture for compound 3a at room temperature.
Figure 8:
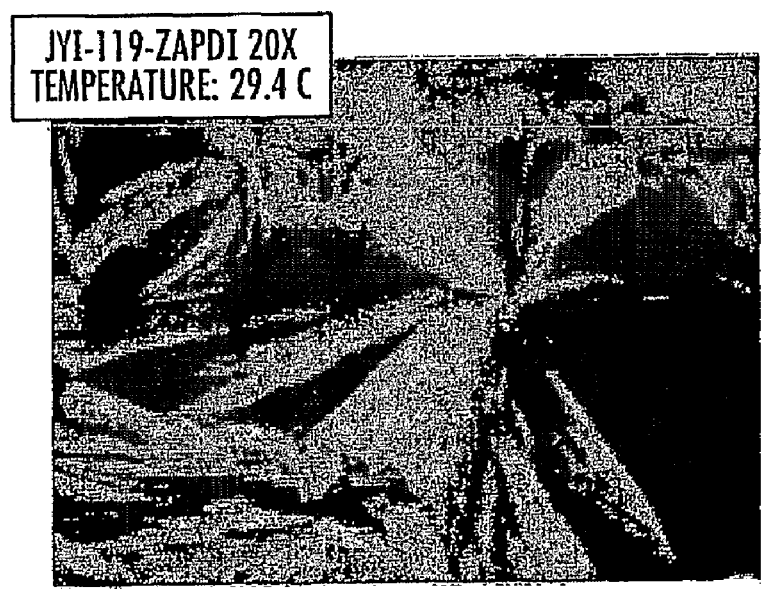
FIG. 8 illustrates the texture for compound 3b at room temperature.

Optical polarization microscopy (OPM): Optical textures were obtained under optical polarization microscope. The samples were prepared by cooling the melts of the compounds sandwiched between two glass slides, which were placed between two crossed polarizers. FIG. 7 illustrates the texture for compound 3b at room temperature. FIG. 8 illustrates the texture for compound 3a at 29.4° C.

Figure 9:
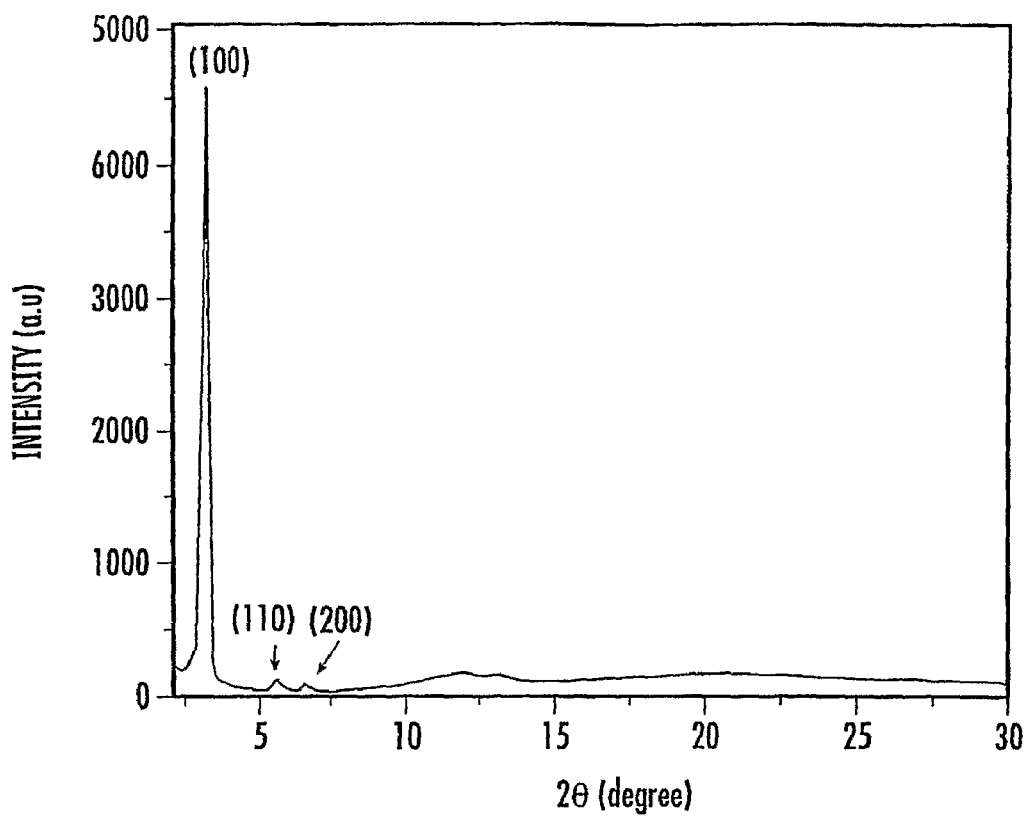
FIG. 9 illustrates the XRD of 3b at room temperature after cooling from the isotropic liquid.

X-ray diffraction (XRD): XRD on samples cooling from the isotropic melt confirmed that both materials are liquid crystals between two thermal transitions and 3b gives a hexagonal columnar mesophase. FIG. 9 illustrates XRD of 3b at room temperature after cooling from the isotropic liquid.

Mobility measurement: The charge carrier mobility of the liquid crystalline compounds have been measured by space-charge limited current (SCLC)[3] method. The sample was prepared by melting the compounds between two ITO glass or ITO/Ag glass separated by spacer.

Figure 10:
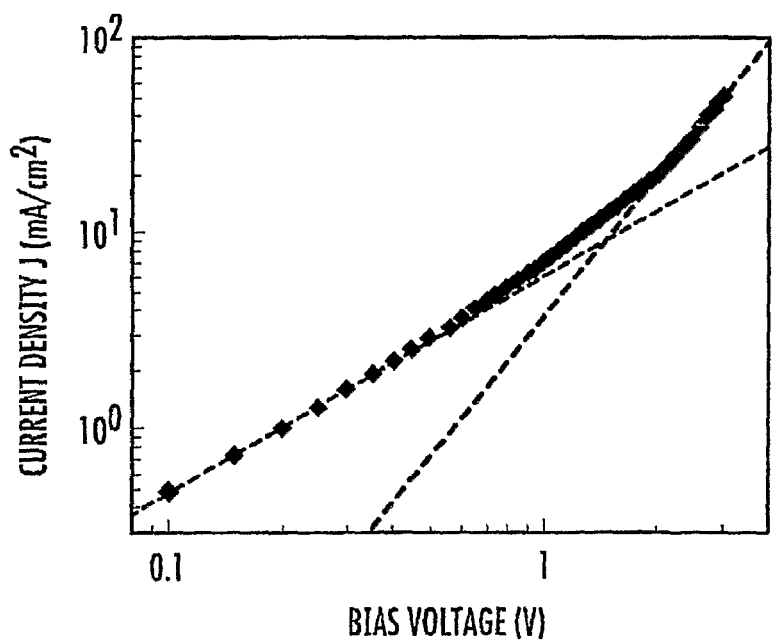
FIG. 10 illustrates the J-V curve of the (+)ITO/compound 3b (5 μm)/Ag(−).

The J-V curve of compounds 3a and 3b are shown in FIG. 10, from which the mobility was derived and summarized in Table 3.

TABLE 3

Summary of charge carrier mobility for compound 3a and 3b.

| Device geometry | $μ_0$ (cm$^2$/Vs) | γ (cm/V)$^{0.5}$ | $μ_{max}$ (cm$^2$/Vs) |
|---|---|---|---|
| 3a (+)ITO/3a (5 μm)/ITO(−) | 0.2 | 2.7 × 10$^{−4}$ | 0.2 at 10 V |
| 3b (+)ITO/3b (5 μm)/ITO(−) | 0.4 | 3.8 × 10$^{−3}$ | 0.5 at 3 V |
| 3b (+)ITO/3b (5 μm)/Ag(−) | 0.9 | 1.2 × 10$^{−2}$ | 2.2 at 3 V |

Figure 17:
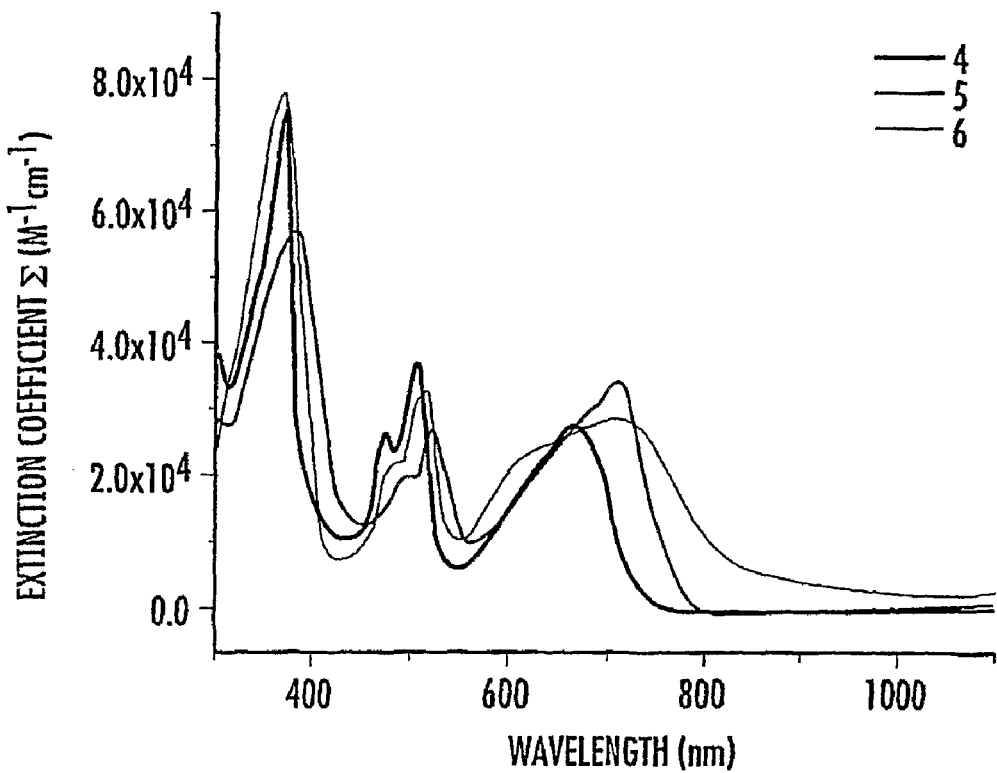
FIG. 17 illustrates the absorption spectra of 4-6 in toluene.

The absorption spectra of 4-6 in toluenene were shown in FIG. 17, They all have wide range of absorption covering UV-Vis, NIR.

References, which are incorporated herein by reference.
1. a) F. Wurthner, C. Thalacker, S. Diele, C. Tschierske *Chem. Eur. J* 2001, 7(10), 2245 b) S. K. Lee, Y. Zu, A. Herrmann, Y. Geerts, K. Mullen, A. J. Bard *J. Am. Chem. Soc.* 1999, 121, 3513. 2. H. Langhals, S. Demmig, H.
2. H. Langhals, S. Demmig, H. Huber *Spectrochim. Acta* 1988, 44A, 1189
3. a) P. W. M. Blom, M. J. M. de Jong, and J. J. M. Vleggaar, *Appl. Phys. Lett.* 1996, 68, 3308 b) M. W. Klein, D. H. Dunlap, G. G. Malliaras *Phys. Rev. B* 2001, 64, 195332.

EXAMPLE 2

The perylenetetracarboxylic diimide charge-transport materials can be used in organic electronic devices, including, but not limited to, organic light-emitting diodes, lasers, photovoltaic cells, photodetectors, active and passive electronic devices, and memories. Active electronic devices include, but are not limited to, diodes and transistors. Passive electronic devices include, but are not limited to, resistors, capacitors, and inductors. Active and passive electronic devices can be combined to form electrical circuits with properties tailored to the need of specific applications. For example, transistors can be combined to form inverters and ring oscillators. Likewise, passive elements can be combined to form resonant circuits and various filters. Electronic devices and circuits are the foundation of modern electronics and are well known in the art. Examples of applications can be found for instance in P. Horowitz and W. Hill, The Art of Electronics, Cambridge University Press, Cambridge, 1989.

Organic electronic devices typically include one or several organic semiconductors that can conduct electrical charge. In devices, such as organic light-emitting diodes, transistors and memories, charges are injected into the organic semiconductor through electrical contacts formed with conductive electrodes such as metals and conductive oxides. In photovoltaic cells and photodetectors, electrical charges are produced by the optical absorption of light. These charges are then collected through electrical contacts formed with conductive electrodes such as metals and conductive oxides. In some devices and circuits it is important to combine two different organic semiconductors, one of which conducts electrons, and the other conducts holes. Preferably, the two semiconductors should have hole and electron mobilities that are comparable. Interfaces formed between such semiconductors are often called heterojunctions.

Figure 11:
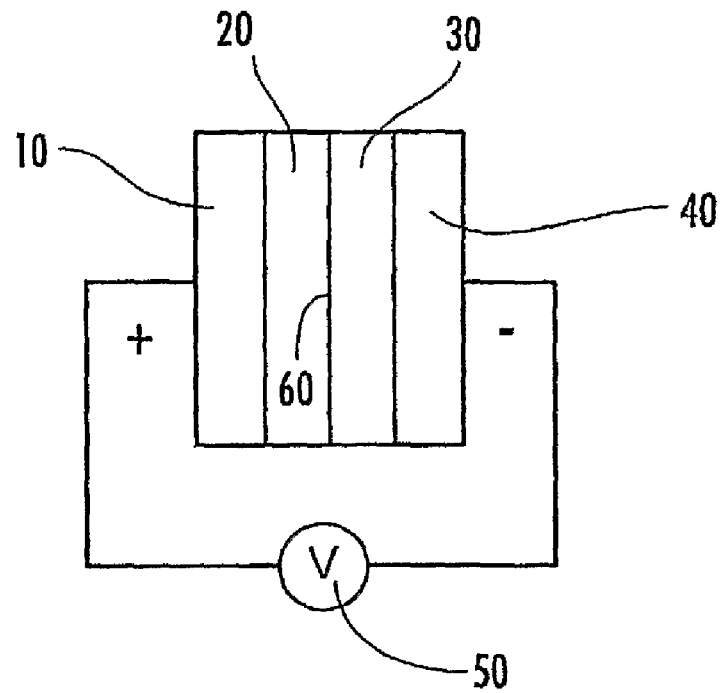
FIG. 11 is a schematic of an organic light-emitting diode.

In an embodiment, the perylenetetracarboxylic diimide charge-transport materials are used as electron-transport materials in organic light-emitting devices. An example of a geometry structure for such a device is shown in FIG. 11. In this device a hole transport organic semiconductor 20 and an electron transport organic semiconductor 30 are sandwiched between an anode 10 and a cathode 40. When a voltage is applied by a power supply 50 with positive electrode applied to anode 10 and negative electrode applied to cathode 40, holes get injected into hole transport semiconductor 20 and electrons get injected into electron transport semiconductor 30. Holes and electrons form excited states at the heterojunction 60, the recombination of which leads to emission of light through at least one of the electrodes (10 or 40) that is semitransparent. The hole transport semiconductor 20 can be a triphenyldiamine (TPD) derivative thin film or other hole transport materials known in the art, the anode 10 can be indium tin oxide (ITO), the electron-transport semiconductor 30 can include one or more of the perylenetetracarboxylic diimide charge-transport materials described herein, and the cathode 40 can be a metal including, but limited to, Ca, Ag, Mg, Al, Au, or mixtures thereof.

Figure 12:
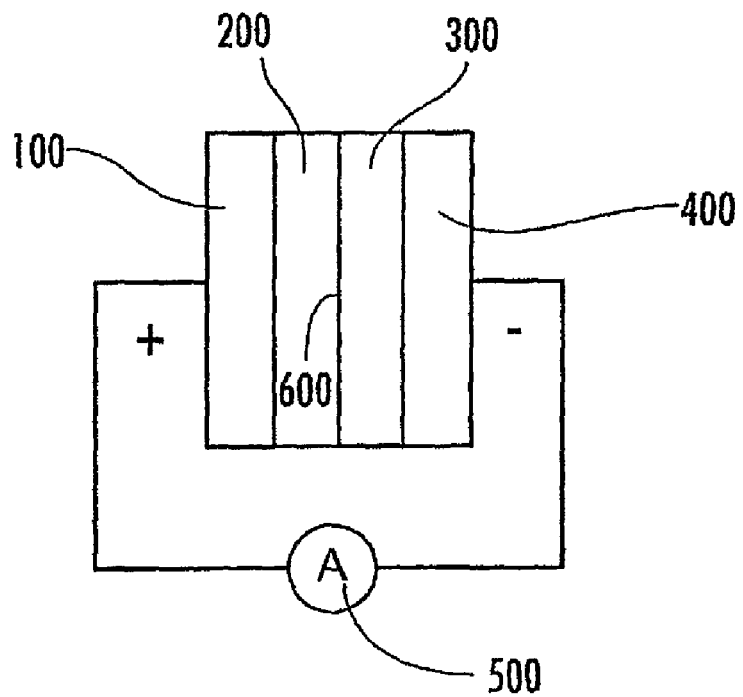
FIG. 12 is a schematic of an organic photovoltaic cell.

In another embodiment, the perylenetetracarboxylic diimide charge-transport materials are used as electron transport materials in photovoltaic cells. In an embodiment, a possible geometry for such a device is shown in FIG. 12. In this device a hole-transport organic semiconductor 200 and an electron-transport organic semiconductor 300 are sandwiched between a first electrode 100 and a second electrode 400. When the device is exposed to light, optical absorption in the organic semiconductors 200 and 300 leads to the formation of excited states that diffuse to the heterojunction 600 where they separate into electron-hole pairs. Holes are transported in the semiconductor layer 200 and get collected by the electrode 100. Electrons are transported in the layer 300 are collected by the electrode 400. The transport of the charges created optically leads to a current that can be measured by an ampmeter 500.

The hole transport semiconductor 200 can be a thin film of triphenyldiamine (TPD), a phthalocyanine, an oligoacene, an oligothiophene or any other organic hole transport material with high hole mobility known in the art, the electrode 100 can be indium tin oxide (ITO) or any other conducting oxide known in the art, the electron transport semiconductor 300 can be comprised of one or more of the perylenetetracarboxylic diimide charge-transport materials described herein, and the second electrode 400 can be a metal including, but limited to, Ca, Ag, Mg, Al, Au, or mixtures thereof. In some cases, an additional layer can be added between 300 and 400 to prevent the dissociation of excited states (also referred to as excitons) near the electrode 400. This layer may be called an exciton-blocking layer.

Figure 13:
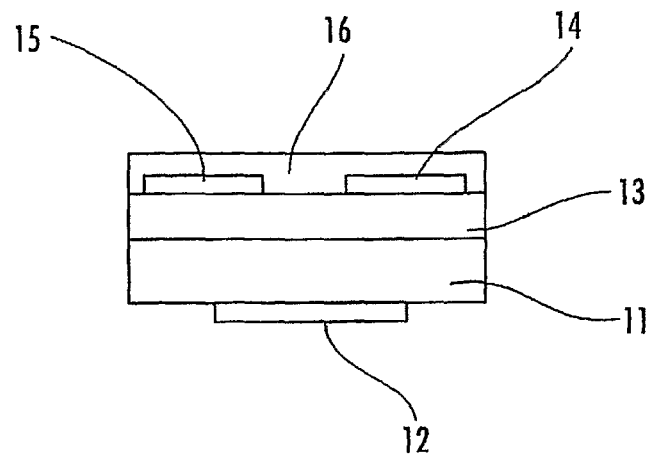
FIG. 13 is a schematic of an organic field-effect transistor with bottom electrodes.
Figure 14:
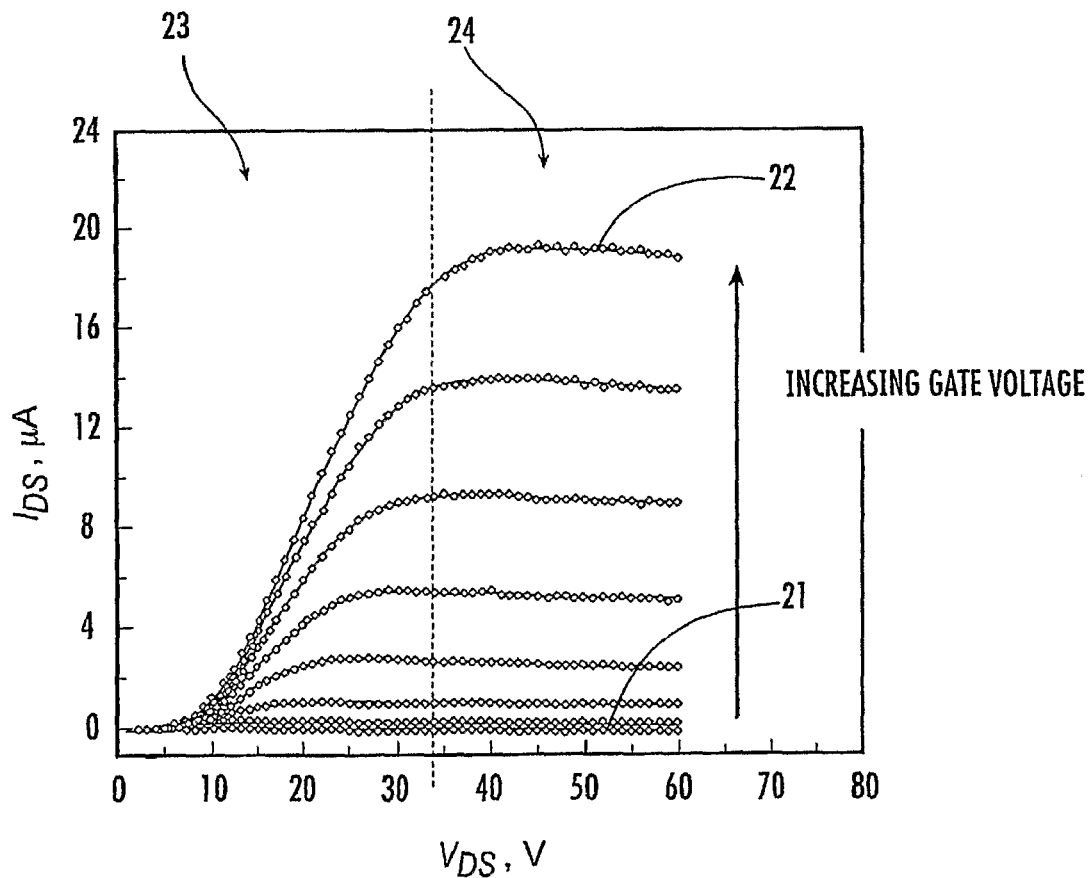
FIG. 14 is a schematic of the electrical output characteristic of an organic field-effect transistor. The curves show the current measured between source and drain electrodes as a function of the voltage between source and drain electrodes.

In another embodiment, the perylenetetracarboxylic diimide charge-transport materials are used as electron transport materials in organic field-effect transistors. In an embodiment, a possible structure for such a device is shown in FIG. 13. The organic electron-transport semiconductor 16 is deposited on top, of a structure that is comprised of a conductive substrate 11 such as highly doped silicon, an'insulator layer 13 such as a thermally-grown silicon oxide layer, a gate electrode 12, a source electrode 15 and a drain electrode 14. A positive voltage applied to the gate electrode changes the density of electrons in the organic semiconductor 16 and will influence the current voltage characteristics measured between the source electrode 15 and the drain electrode 14. The typical electrical output characteristic of a field-effect transistor is shown in FIG. 14. When a low voltage is applied between the source electrode 15 and the drain electrode 14 a small current is measured, as shown by curve 21. In contrast, when a larger gate voltage is applied between the source electrode 15 and the drain electrode 14, a large current is measured, as shown by curve 22. For a given gate voltage, the electrical characteristics 21 and 22 have a linear regime 23 and a saturation regime 24. These electrical characteristics are similar to those measured for MOSFET transistors including inorganic semiconductors including silicon and germanium.

At low drain voltage where the response is linear (as shown by region 23 in FIG. 14), the current –voltage response is given by:

$$I_D = \frac{WC_{ox}\mu}{L}\left(V_G - V_T - \frac{V_D}{2}\right)V_D \tag{1}$$

Where W is the channel width, L the distance between source and drain electrodes (channel length), $C_{ox}$ is the capacitance per unit area of the insulator, $V_T$ is the threshold voltage and µ is the "effective" field-effect mobility, which can be calculated in this regime from the transconductance defined by:

$$g_m = \left.\frac{\partial I_D}{\partial V_G}\right|_{V_D=const.} = \frac{WC_{ox}}{L}\mu V_D \tag{2}$$

For large drain voltages (as shown by region 24 in FIG. 14), the saturated drain current $I_{Dsat}$ is given by the so-called "square-law":

$$I_{Dsat} = \frac{WC_{ox}\mu}{2L}(V_G - V_T)^2 \qquad (3)$$

In this regime, mobility can be extracted from the slope of the plot of the square root of the drain current versus gate voltage. Such a curve is called a transfer curve.

Figure 15:
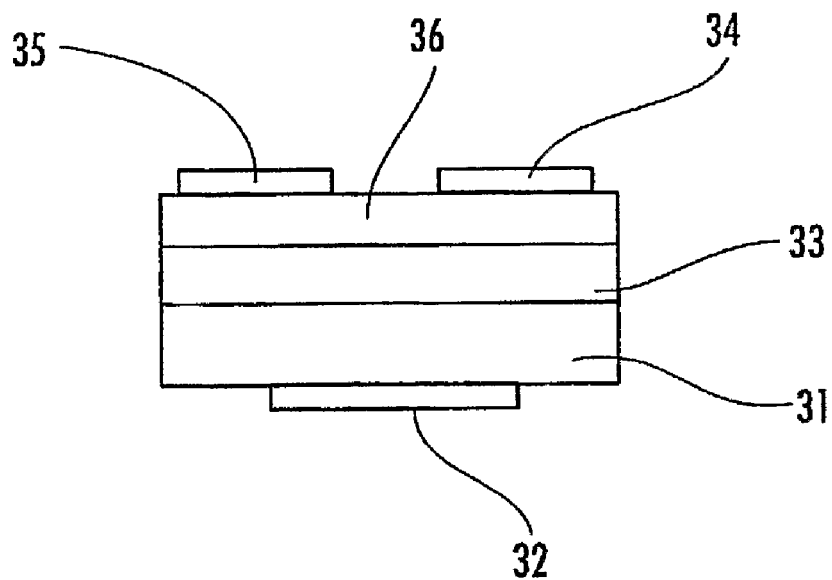
FIG. 15 is a schematic of an organic field-effect transistor with top electrodes.

Another geometry for an organic field-effect transistor is shown in FIG. 15. The organic electron-transport semiconductor 36 is deposited on top of a structure that includes a conductive substrate 31 such as highly doped silicon, an insulator layer 33 such as a thermally grown silicon oxide layer, a gate electrode 32. In this geometry, source electrode 15 and a drain electrode 14 are deposited on top of the semiconductor layer 36.

Figure 16A:
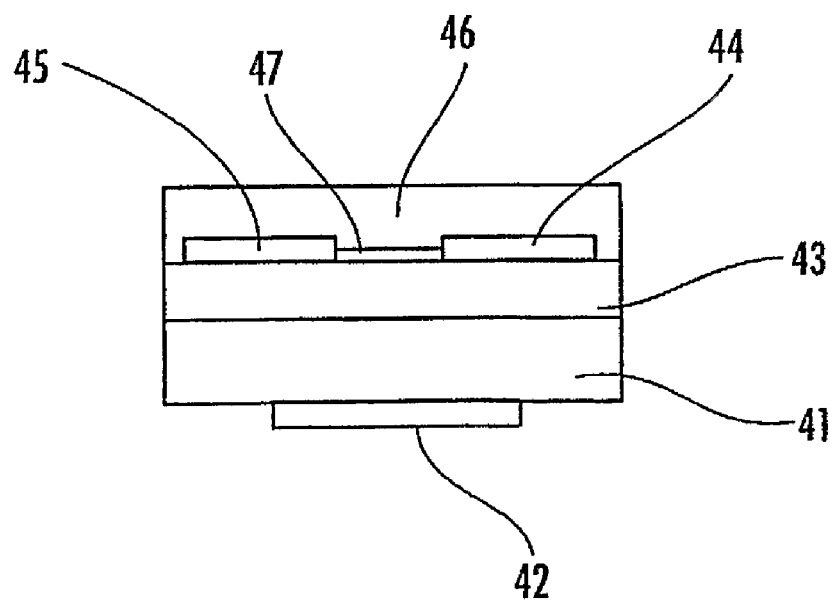
FIG. 16A is a schematic of an organic field-effect transistor with a surface modifier and with bottom electrodes.
Figure 16B:
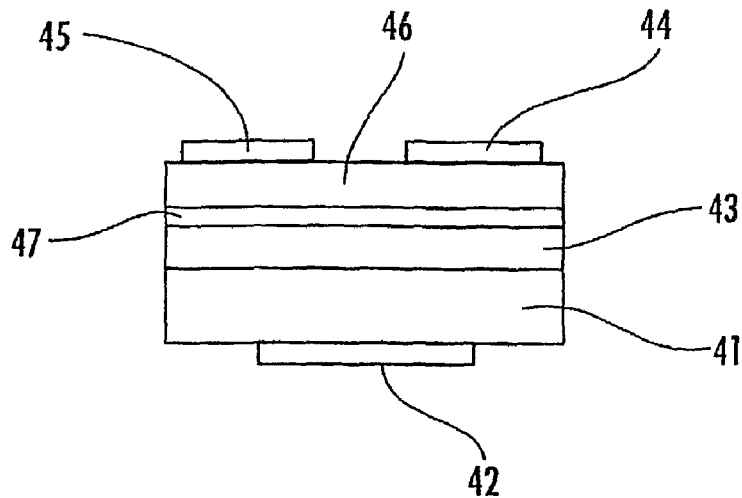
FIG. 16B is a schematic of an organic field-effect transistor with a surface modifier and top electrodes.

Another geometry for an organic field-effect transistor is shown in FIGS. 16A and 16B. In this geometry, an additional layer is introduced between the gate insulator 43 and the organic semiconductor 46. This layer modifies the properties of the surface of the gate insulator and improves its compatibility with the organic semiconductors. The surface modifier 47 can be a self-assembled monolayer leading to a thin layer. It can be deposited on top of the gate insulator 43 after the deposition of the source and drain electrodes, 45 and 44, respectively, and before the deposition of the organic semiconductor 46, as shown in FIG. 16A. Alternatively, layer 47 can be deposited on top of the gate insulator 43 before deposition of the organic semiconductor 46, as shown in FIG. 16B.

Therefore the following is claimed:

1. A homopolymer comprising a monomer, comprising:
a perylenetetracarboxylic diimide charge-transport material monomer having a structure of Formula I:

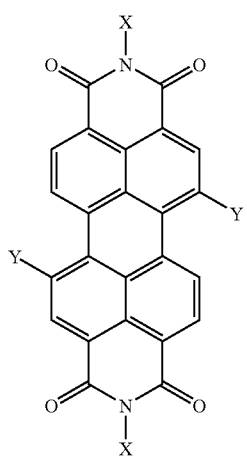

Formula I wherein Y in each instance is independently selected from a polymerizable group; and
wherein X in each instance can be independently selected from the following: a polymerizable group; 3,4,5-trialkylphenyl; 3,4,5-tri-perfluorinated-alkylphenyl; 3,4,5-tri-oligomeric-ether-substituted phenyl; 3,4,5-trialkoxybenzyl; 3,4,5-trialkylbenzyl; 3,4,5-tri-perfluorinated-alkyl benzyl; 3,4,5-tri-perfluorinated-alkoxy benzyl; 3,4,5-tri-oligomeric-ether-substituted benzyl; 3,4-dialkylphenyl; 3,4-di-perfluorinated-alkylphenyl; 3,4-di-oligomeric-ether-substituted phenyl; 3,4-dialkoxybenzyl; 3,4-dialkylbenzyl; 3,4-di-perfluorinated-alkylbenzyl; 3,4-di-perfluorinated-alkoxybenzyl; 3,4-di-oligomeric-ether-substituted benzyl; 3,5-dialkylphenyl; 3,5-di-perfluorinated-alkyl phenyl; 3,5-di-oligomeric-ether-substituted phenyl; 3,5-dialkoxybenzyl; 3,5-dialkylbenzyl; 3,5-di-perfluorinated-alkyl benzyl; 3,5-di-oligomeric-ether-substituted benzyl; or the following units:

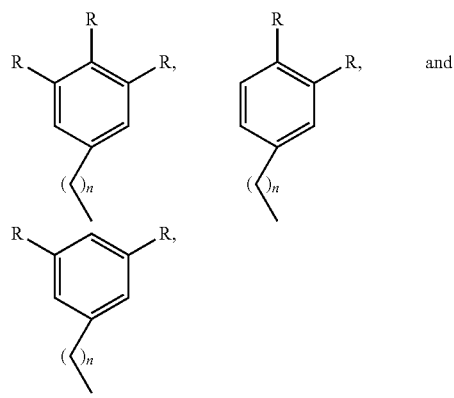

wherein R in each instance can be independently selected from the following: a polymerizable group, an alkyl, an alkoxy, a perfluorinated alkyl, a perfluorinated alkoxy, an oligomeric-ether, wherein R may denote units that can form dendrimers, and wherein the subscript n is a number from 0 to 20, and wherein the polymerizable group is selected from: vinyl; allyl; 4-styryl; acroyl; epoxide; oxetane; cyclic-carbonate; methacroyl; acrylonitrile; isocyanate; isothiocyanate; epoxides; strained ring olefins; $(-CH_2)_n SiCl_3$; $(-CH_2)_n Si(OCH_2CH_3)_3$; $(-CH_2)_n Si(OCH_3)_3$, where $n$ is an integer number from 0 to 25; and compounds having the following structures:

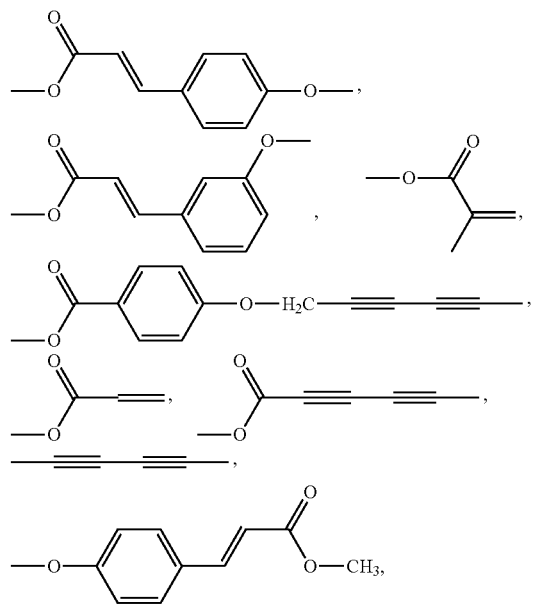

-continued

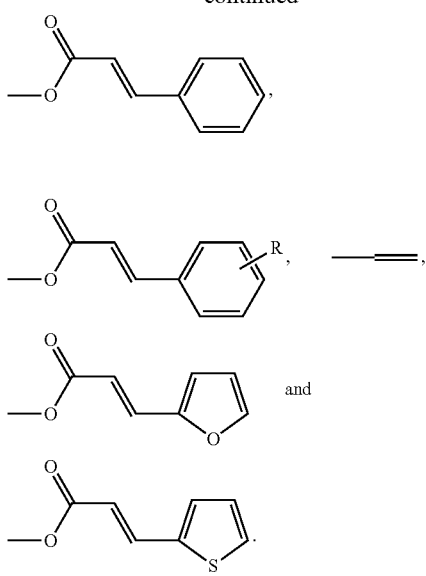

2. A homopolymer comprising a monomer, comprising:

a perylenetetracarboxylic diimide charge-transport material monomer having a structure of Formula I:

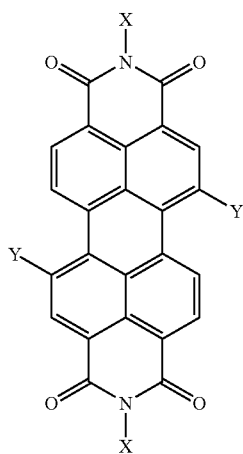

Formula I wherein Y in each instance is independently selected from a polymerizable group; and X in each instance can be independently selected from the following: a polymerizable group; hydrogen; halogens; $C_1$-$C_{18}$-alkyl; aryloxy, arylthio, heteroaryloxy and heteroarylthio, and wherein each can be independently substituted by the following: $C_1$-$C_{10}$-alkyl, $C_1$-$C_6$-alkoxy, cyano, and carboxyl, wherein Y is selected from: —C≡C-aryl; —(C≡C)-$_2$aryl; —(C≡C)-$_3$aryl; —(HC═CH)$_2$-aryl; and —(HC═CH)$_3$-aryl, and wherein the charge-transport material absorbs near-infrared energy from about 700 to 1500 nm.

3. A homopolymer comprising a monomer, comprising:

a perylenetetracarboxylic diimide charge-transport material monomer having a structure of Formula I:

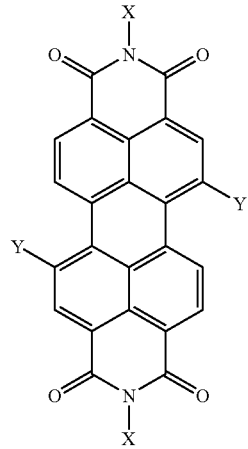

Formula I wherein Y in each instance is independently selected from a polymerizable group; and wherein X in each instance can be independently selected from the following: a polymerizable group; methyl, ethyl, propyl, isopropyl, butyl, isobutyl, sec-butyl, tert-butyl, pentyl, isopentyl, neopentyl, tert-pentyl, hexyl, 2-methylpentyl, heptyl, 1-ethylpentyl, octyl, 2-ethylhexyl, isooctyl, nonyl, isononyl, decyl, isodecyl, undecyl, dodecyl, tridecyl, isotridecyl, tetradecyl, pentadecyl, hexadecyl, heptadecyl, octadecyl, nonadecyl and eicosyl; 2-methoxyethyl, 2-ethoxyethyl, 2-propoxyethyl, 2-isopropoxyethyl, 2-butoxyethyl, 2-methoxypropyl, 3-methoxypropyl, 2-ethoxypropyl, 3-ethoxypropyl, 2-propoxypropyl, 3-propoxypropyl, 2-butoxypropyl, 3-butoxypropyl, 2-methoxybutyl, 4-methoxybutyl, 2-ethoxybutyl, 4-ethoxybutyl, 2-propoxybutyl, 4-propoxybutyl, 3,6-dioxaheptyl, 3,6-dioxaoctyl, 4,8-dioxanonyl, 3,7-dioxaoctyl, 3,7-dioxanonyl, 4,7-dioxaoctyl, 4,7-dioxanonyl, 2- and 4-butoxybutyl, 4,8-dioxadecyl, 3,6,9-trioxadecyl, 3,6,9-trioxaundecyl, 3,6,9-trioxadodecyl, 3,6,9,12-tetraoxamidecyl and 3,6,9,12-tetraoxatetradecyl; 2-methylthioethyl, 2-ethylthioethyl, 2-propylthioethyl, 2-isopropylthioethyl, 2-butylthioethyl, 2-methylthiopropyl, 3-methylthiopropyl, 2-ethylthiopropyl, 3-ethylthiopropyl, 2-propylthiopropyl, 3-propylthiopropyl, 2-butylthiopropyl, 3-butylthiopropyl, 2-methylthiobutyl, 4-methylthiobutyl, 2-butylthiopropyl, 4-ethylthiobutyl, 2-propylthiobutyl, 4-propylthiobutyl, 3,6-dithiaheptyl, 3,6-dithiaoctyl, 4,8-dithianonyl, 3,7-dithiaoctyl, 3,7-dithianonyl, 4,7-dithiaoctyl, 4,7-dithianonyl, 2-butylthiobutyl, 4-butylthiobutyl, 4,8-dithiadecyl, 3,6,9-trithiadecyl, 3,6,9-trithiaundecyl, 3,6,9-trithiadodecyl, 3,6,9,12-tetrathiamidecyl, 3,6,9,12-tetrathiatetradecyl; 2-monomethylaminoethyl, 2-monoethylaminoethyl, 2-dimethylaminoethyl, 2-dimethylaminopropyl, 3-dimethylaminopropyl, 3-monoisopropylaminopropyl, 2-monopropylaminobutyl, 4-monopropylaminobutyl, 2-dimethylaminobutyl, 4-dimethylaminobutyl, 6-methyl-3,6-diazaheptyl, 3,6-dimethyl-3,6-diazaheptyl, 3,6-diazaoctyl, 3,6-dimethyl-3,6-diazaoctyl, 9-methyl-3,6,9-triazadecyl, 3,6,9-trimethyl-3,6,9-triazadecyl, 3,6,9-triazaundecyl, 3,6,9-trimethyl-3,6,9-triazaundecyl, 12-methyl-3,6,9,12-tetraazamidecyl and 3,6,9,12-tetramethyl-3,6,9,12-tetraazamidecyl; propan-2-on-1-yl, butan-3-on-1-yl, butan-3-on-2-yl and 2-ethylpentan-3-on-1-yl; 2-methylsulfonylethyl, 2-ethylsulfonylethyl, 2-propylsulfonylethyl, 2-isopropylsulfonylethyl, 2-butylsulfonylethyl, 2-methylsulfonylpropyl, 3-methylsulfonylpropyl, 2-ethylsulfonylpropyl, 3-ethylsulfonylpropyl, 2-propylsulfonylpropyl, 3-propylsulfonylpropyl, 2-butylsulfonylpropyl, 3-butylsulfonylpropyl, 2-methylsulfonylbutyl, 4-methylsulfonylbutyl, 2-ethylsulfonylbutyl, 4-ethylsulfonylbutyl, 2-propylsulfonylbutyl, 4-propylsulfonylbutyl, and 4-butylsulfonylbutyl; carboxymethyl, 2-carboxyethyl, 3-carboxypropyl, 4-carboxybutyl, 5-carboxypentyl, 6-carboxyhexyl, 8-carboxyoctyl, 10-carboxydecyl, 12-carboxydodecyl and 14-carboxytetradecyl; sulfomethyl, 2-sulfoethyl, 3-sulfopropyl, 4-sulfobutyl, 5-sulfopentyl, 6-sulfohexyl, 8-sulfooctyl, 10-sulfodecyl, 12-sulfododecyl and 14-sulfotetradecyl; 2-hydroxyethyl, 2-hydroxypropyl, 1-hydroxyprop-2-yl, 2-hydroxybutyl, 4-hydroxybutyl, 1-hydroxybut-2-yl and 8-hydroxy-4-oxaoctyl, 2-cyanoethyl, 3-cyanopropyl, 2-methyl-3-ethyl-3-cyanopropyl, 7-cyano-7-ethylheptyl and 4-methyl-7-methyl-7-cyanoheptyl; methoxy, ethoxy, propoxy, isopropoxy, butoxy, isobutoxy, sec-butoxy, tert-butoxy, pentoxy, isopentoxy, neopentoxy, tert-pentoxy and hexoxy; carbamoyl, methylaminocarbonyl, ethylaminocarbonyl, propylaminocarbonyl, butylaminocarbonyl, pentylaminocarbonyl, hexylaminocarbonyl, heptylaminocarbonyl, octylaminocarbonyl, nonylaminocarbonyl, decylaminocarbonyl and phenylaminocarbonyl; formylamino, acetylamino, propionylamino and benzoylamino; chlorine, bromine and iodine; phenylazo, 2-naphthylazo, 2-pyridylazo and 2-pyrimidylazo; cyclopentyl, cyclohexyl, cycloheptyl, cyclooctyl, 2-dioxanyl, 4-morpholinyl, 2-tetrahydrofuryl, 3-tetrahydrofuryl, 1-pyrrolidinyl, 2-pyrrolidinyl, 3-pyrrolidinyl and 1-piperidyl, 2-piperidyl, 3-piperidyl, and 4-piperidyl; phenyl, 2-naphthyl, 2-pyrryl, and 3-pyrryl, 2-pyridyl, 3-pyridyl, 4-pyridyl, 2-pyrimidyl, 4-pyrimidyl, 5-pyrimidyl, 3-pyrazolyl, 4-pyrazolyl, 5-pyrazolyl, 2-imidazolyl, 4-imidazolyl, 5-imidazolyl, 2-thiazolyl, 4-thiazolyl, 5-thiazolyl, 3-(1,2,4-triazyl), 2-(1,3,5-triazyl), 6-quinaldyl, 3-quinolinyl, 5-quinolinyl, 6-quinolinyl, 8-quinolinyl, 2-benzoxazolyl, 2-benzothiazolyl, 5-benzothiadiazolyl, 2-benzimidazolyl, 5-benzimidazolyl, and 1-isoquinolyl, and 5-isoquinolyl; 2-methylphenyl, 3-methylphenyl, 4-methylphenyl, 2,4-dimethylphenyl, 2,6-dimethylphenyl, 2,4,6-trimethylphenyl, 2-ethylphenyl, 3-ethylphenyl, 4-ethylphenyl, 2,4-diethylphenyl, 3,5-diethylphenyl, 2,6-diethylphenyl, 2,4,6-triethylphenyl, 2-propylphenyl, 3-propylphenyl, 4-propylphenyl, 2,4-, 2,6-dipropylphenyl, 2,4,6-tripropylphenyl, 2-isopropylphenyl, 3-isopropylphenyl, 4-isopropylphenyl, 2,4-diisopropylphenyl, 3,5-diisopropylphenyl, 2,6-diisopropylphenyl, 2,4,6-triisopropylphenyl, 2-butylphenyl, 3-butylphenyl, 4-butylphenyl, 2,4-dibutylphenyl, 2,6-dibutylphenyl, 2,4,6-tributylphenyl, 2-isobutylphenyl, 3-isobutylphenyl, 4-isobutylphenyl, 2,4-diisobutylphenyl, 2,6-diisobutylphenyl, 2,4,6-triisobutylphenyl, 2-butylphenyl, 3-butylphenyl, 4-sec-butylphenyl, 2,4-, 2,6-di-sec-butylphenyl and 2,4,6-tri-sec-butylphenyl; 2-methoxyphenyl, 3-methoxyphenyl, 4-methoxyphenyl, 2-chlorophenyl, 3-chlorophenyl, 4-chlorophenyl, 2,4-dichlorophenyl, 3,5-dichlorophenyl, and 2,6-dichlorophenyl; 2-hydroxyphenyl, 3-hydroxyphenyl, 4-hydroxyphenyl, 2,4-dichlorophenyl, 3,5-dichlorophenyl, and 2,6-dichlorophenyl; 2-hydroxyphenyl, 3-hydroxyphenyl, 4-hydroxyphenyl, 2,4-dihydroxyphenyl, 3,5-dihydroxyphenyl, and 2,6-dihydroxyphenyl; 2-cyanophenyl, 3-cyanophenyl, and 4-cyanophenyl; 3-carboxyphenyl and 4-carboxyphenyl; 3- carboxyamidophenyl, 4-carboxyamidophenyl, 3-N-methylcarboxamidophenyl, 4-N-methyl carboxamidophenyl, 3-N-ethyl carboxamidophenyl, and 4-N-ethylcarboxamidophenyl; 3-acetylaminophenyl, 4-acetylaminophenyl, 3- propionyl aminophenyl, 4-propionylaminophenyl, 3-butyrylaminophenyl, and 4-butyrylaminophenyl; 3- phenylaminophenyl, 4-N-phenylaminophenyl, 3-(o-tolyl)aminophenyl, 4-N-(o-tolyl) aminophenyl, 3-(m-tolyl)aminophenyl, 4-N-(m-tolyl)aminophenyl, 3-(p-tolyl)aminophenyl, and 4-(p-tolyl)aminophenyl; 3-(2-pyridyl)aminophenyl, 4-(2-pyridyl)aminophenyl, 3-(3-pyridyl)aminophenyl, 4-(3-pyridyl)aminophenyl, 3-(4-pyridyl)aminophenyl, 4-(4-pyridyl)aminophenyl, 3-(2-pyrimidyl)aminophenyl, 4-(2-pyrimidyl)aminophenyl, and 4-(4-pyrimidyl)aminophenyl; 4-phenylazophenyl, 4-(1-naphthylazo)phenyl, 4-(2-naphthylazo)phenyl, 4-(4-naphthylazo)phenyl, 4-(2-pyridylazo)phenyl, 4-(3-pyridylazo)phenyl, 4-(4-pyridylazo)phenyl, 4-(2-pyrimidylazo)phenyl, 4-(4-pyrimidylazo)phenyl and 4-(5-pyrimidylazo)phenyl; and phenoxy, phenylthio, 2-naphthoxy, 2-naphthylthio, 2-pyridyloxy, 3-pyridyloxy, 4-pyridyloxy, 2-pyridylthio, 3-pyridylthio, 4-pyridylthio, 2-pyrimidyloxy, 4-pyrimidyloxy, 5-pyrimidyloxy, 2-pyrimidylthio, 4-pyrimidylthio, and 5-pyrimidylthio, wherein Y is selected from: —C≡C-aryl; —(C≡C)-$_2$aryl; —(C≡C)-$_3$aryl; —HC═CH-aryl; —(HC═CH)$_2$-aryl; and —(HC═CH)$_3$-aryl, and wherein the charge-transport material absorbs near-infrared energy from about 700 to 1500 nm.

\* \* \* \* \*